US009341932B2

(12) United States Patent
Nishioka

(10) Patent No.: US 9,341,932 B2
(45) Date of Patent: May 17, 2016

(54) LIGHT EMITTING DEVICE, SUPER-LUMINESCENT DIODE, AND PROJECTOR

(71) Applicant: Seiko Epson Corporation, Tokyo (JP)

(72) Inventor: Hiroki Nishioka, Chino (JP)

(73) Assignee: Seiko Epson Corporation (JP)

( * ) Notice: Subject to any disclaimer, the term of this patent is extended or adjusted under 35 U.S.C. 154(b) by 292 days.

(21) Appl. No.: 14/165,726

(22) Filed: Jan. 28, 2014

(65) Prior Publication Data

US 2014/0218701 A1    Aug. 7, 2014

(30) Foreign Application Priority Data

Feb. 1, 2013    (JP) .................................. 2013-018181

(51) Int. Cl.

| H01L 33/00 | (2010.01) |
|---|---|
| G03B 21/20 | (2006.01) |
| H04N 9/31 | (2006.01) |
| H01L 27/15 | (2006.01) |
| H01L 33/08 | (2010.01) |
| H01L 33/58 | (2010.01) |
| H01L 33/20 | (2010.01) |
| H01L 33/44 | (2010.01) |
| H01L 33/38 | (2010.01) |
| H01L 33/60 | (2010.01) |

(52) U.S. Cl.
CPC ........ *G03B 21/2033* (2013.01); *G03B 21/2066* (2013.01); *H01L 27/15* (2013.01); *H01L 33/0045* (2013.01); *H04N 9/315* (2013.01); *H04N 9/3105* (2013.01); *H04N 9/3164* (2013.01); *H01L 27/153* (2013.01); *H01L 33/08* (2013.01); *H01L 33/20* (2013.01); *H01L 33/38* (2013.01); *H01L 33/44* (2013.01); *H01L 33/58* (2013.01); *H01L 33/60* (2013.01)

(58) Field of Classification Search
CPC .................................................... H01L 33/0045
See application file for complete search history.

(56) References Cited

U.S. PATENT DOCUMENTS

| 2010/0140632 A1* | 6/2010 | Doussiere | ........... H01L 33/0045 257/88 |
|---|---|---|---|
| 2010/0187966 A1* | 7/2010 | Mochizuki | .............. H01L 33/60 313/114 |
| 2010/0259758 A1* | 10/2010 | Asano | ..................... H01L 27/15 356/479 |

(Continued)

FOREIGN PATENT DOCUMENTS

| JP | 10-084130 | 3/1998 |
|---|---|---|
| JP | 2009-238828 A | 10/2009 |

(Continued)

OTHER PUBLICATIONS

Extended European Search Report for Patent Application No. EP14153214.3 mailed Dec. 14, 2015 (8 pages).

*Primary Examiner* — Joshua King
(74) *Attorney, Agent, or Firm* — Harness, Dickey & Pierce, P.L.C.

(57) ABSTRACT

A light emitting device includes a laminated body having an active layer, a first cladding layer, and a second cladding layer, the active layer constitutes an optical waveguide, the optical waveguide includes a first portion connecting a first exit section and a first reflecting section to each other, a second portion connecting the first reflecting section and a second reflecting section to each other, and a third portion connecting the second reflecting section and a second exit section to each other, and a current density in the first portion and a current density in the third portion are higher than a current density in the second portion.

20 Claims, 11 Drawing Sheets

(56) References Cited

U.S. PATENT DOCUMENTS

2010/0322278 A1 * 12/2010 Mochizuki ............ B82Y 20/00
    372/45.01
2011/0303924 A1    12/2011 Mochizuki

FOREIGN PATENT DOCUMENTS

| | | |
|---|---|---|
| JP | 2011-065050 A | 3/2011 |
| JP | 2011-155103 A | 8/2011 |

* cited by examiner

LIGHT EMITTING DEVICE, SUPER-LUMINESCENT DIODE, AND PROJECTOR

BACKGROUND

1. Technical Field

The present invention relates to a light emitting device, a super-luminescent diode, and a projector.

2. Related Art

In order to realize a small-seized and high-luminance projector, it is required to improve the emission efficiency of a light source, and reduce the loss and the number of components of an optical system. By using a super luminescent diode (hereinafter also referred to as an "SLD") as the light source, it is possible to eliminate a dichroic mirror necessary for a color separation optical system, and a rotary diffuser plate necessary to ensure the safety of a semiconductor laser and to reduce the speckle noise.

Further, there has been proposed a system (a backlight system) of disposing the SLD immediately below a light valve, and performing light collection and uniform illumination at the same time using microlenses in order to reduce the loss and the number of components of the optical system. In the case of the backlight system, for the sake of convenience of manufacturing accuracy of the microlenses, it is necessary to dispose the emission surfaces at intervals of about several hundreds micrometers through several millimeters. This can be realized by the SLD having a roughly bracket-shaped optical waveguide described in, for example, JP-A-2011-155103.

However, in such an SLD as described above, the light guided inside the active layer is amplified in an exponential manner toward the emission section side (the side with low reflectance). Therefore, on the emission section side, the carriers become short relatively to the light. Thus, the saturation of gain might occur, and the light output might be degraded in some cases.

SUMMARY

An advantage of some aspects of the invention is to provide a light emitting device capable of inhibiting the light output from degrading due to the saturation of the gain. Another advantage of some aspects of the invention is to provide a super-luminescent diode capable of inhibiting the light output from degrading due to the saturation of the gain. Still another advantage of some aspects of the invention is to provide a projector including the light emitting device described above or the super-luminescent diode described above.

A light emitting device according to an aspect of the invention includes a laminated body having an active layer adapted to generate light in response to injection of a current, a first cladding layer and a second cladding layer sandwiching the active layer, a first electrode electrically connected to the first cladding layer, and a second electrode, a third electrode, and a fourth electrode electrically connected to the second cladding layer, the active layer constitutes an optical waveguide adapted to guide the light, the optical waveguide includes a first portion having a belt-like shape connecting a first exit section disposed on a first side surface of the active layer and a first reflecting section disposed on a second side surface of the active layer to each other, a second portion having a belt-like shape connecting the first reflecting section and a second reflecting section disposed on a third side surface of the active layer to each other, and a third portion having a belt-like shape connecting the second reflecting section and a second exit section disposed on the first side surface to each other, a current is injected into the first portion by the first electrode and the second electrode, a current is injected into the second portion by the first electrode and the third electrode, a current is injected into the third portion by the first electrode and the fourth electrode, and a current density of the current injected into the first portion by the first electrode and the second electrode, and a current density of the current injected into the third portion by the first electrode and the fourth electrode are higher than a current density of the current injected into the second portion by the first electrode and the third electrode.

According to such a light emitting device as described above, the light output can be inhibited from degrading due to the saturation of the gain. Further, according to such a light emitting device as described above, the distance between the first exit section and the second exit section can be adjusted using the second portion without increasing the size in the direction perpendicular to the first side surface. Thus, in the case of using such a light emitting device as described above as the light source of a projector, the distance between the first exit section and the second exit section can easily be adjusted in accordance with, for example, the size of the microlenses (the lens array).

It should be noted that in the descriptions related to the invention, the term "electrically connected" is used in such a phrase as "a specific member (hereinafter referred to as a "member B") "electrically connected" to another specific member (hereinafter referred to as a "member A")." In the descriptions related to the invention, in such a case as this example, the term "electrically connected" is used in order to include the case in which the member A and the member B are electrically connected while having direct contact with each other, and the case in which the member A and the member B are electrically connected to each other via another member.

The light emitting device according to the aspect of the invention may be configured such that a first contact section, which is a part where the second electrode and the laminated body have electrical contact with each other, a second contact section, which is a part where the third electrode and the laminated body have electrical contact with each other, and a third contact section, which is a part where the fourth electrode and the laminated body have electrical contact with each other are separated from the first reflecting section and the second reflecting section viewed from a stacking direction of the laminated body.

According to such a light emitting device as described above, the carriers can be inhibited from migrating due to the difference in carrier density caused by the first reflecting section and the second reflecting section. As a result, the light output can be inhibited from degrading.

The light emitting device according to the aspect of the invention may be configured such that a current is further injected into the first portion by the first electrode and the third electrode, and a current is further injected into the third portion by the first electrode and the third electrode.

According to such a light emitting device as described above, the light output can be inhibited from degrading due to the saturation of the gain.

The light emitting device according to the aspect of the invention may be configured such that the current density of the current injected into the first portion by the first electrode and the second electrode and the current density of the current injected into the third portion by the first electrode and the fourth electrode are equal to each other.

According to such a light emitting device as described above, the current control when driving the light emitting device can be made easy.

The light emitting device according to the aspect of the invention may be configured such that the second electrode and the fourth electrode are electrically connected to each other.

According to such a light emitting device as described above, the current density of the current injected into the first portion by the first electrode and the second electrode and the current density of the current injected into the third portion by the first electrode and the fourth electrode can easily be made equal to each other.

The light emitting device according to the aspect of the invention may be configured such that the laminated body includes a first groove section disposed between a first contact section, which is a part where the second electrode and the laminated body have electrical contact with each other, and a second contact section, which is a part where the third electrode and the laminated body have electrical contact with each other, and at a position overlapping the optical waveguide viewed from a stacking direction of the laminated body, and a second groove section disposed between the second contact section and a third contact section, which is a part where the fourth electrode and the laminated body have electrical contact with each other, and at a position overlapping the optical waveguide viewed from the stacking direction of the laminated body.

According to such a light emitting device as described above, the carriers can be inhibited from migrating due to the difference in carrier density caused by the first reflecting section and the second reflecting section.

The light emitting device according to the aspect of the invention may be configured such that the laminated body includes a contact layer formed on the second cladding layer, and the first groove section and the second groove section are provided to the contact layer.

According to such a light emitting device as described above, the carriers can be inhibited from migrating due to the difference in carrier density caused by the first reflecting section and the second reflecting section.

The light emitting device according to the aspect of the invention may be configured such that the first groove section and the second groove section penetrate the contact layer to reach the second cladding layer.

According to such a light emitting device as described above, the carriers can more surely be inhibited from migrating due to the difference in carrier density caused by the first reflecting section and the second reflecting section.

The light emitting device according to the aspect of the invention may be configured such that the first groove section and the second groove section penetrate the contact layer and the second cladding layer.

According to such a light emitting device as described above, the carriers can more surely be inhibited from migrating due to the difference in carrier density caused by the first reflecting section and the second reflecting section.

The light emitting device according to the aspect of the invention may be configured such that the first portion and the third portion are connected to the first side surface obliquely with respect to a perpendicular of the first side surface viewed from a stacking direction of the laminated body.

According to such a light emitting device as described above, it can be reduced to multiply-reflect the light generated in the optical waveguide directly between the first exit section and the second exit section. Thus, it can be prevented to constitute a direct resonator, and thus, the laser oscillation of the light generated in the optical waveguide can be suppressed. Therefore, in such a light emitting device as described above, the speckle noise can be reduced.

A light emitting device according to another aspect of the invention includes an active layer adapted to generate light in response to injection of a current, the active layer includes a first exit section and a second exit section each adapted to emit the light, an optical waveguide adapted to connect the first exit section and the second exit section to each other, and a first inflecting section and a second inflecting section at which a proceeding direction of the light guided by the optical waveguide is changed, a current density of a current injected into a part of the optical waveguide located between the first exit section and the first inflecting section is higher than a current density of a current injected into a part of the optical waveguide located between the first inflecting section and the second inflecting section, and a current density of a current injected into apart of the optical waveguide located between the second exit section and the second inflecting section is higher than the current density of the current injected into the part of the optical waveguide located between the first inflecting section and the second inflecting section.

According to such a light emitting device as described above, the light output can be inhibited from degrading due to the saturation of the gain.

A projector according to another aspect of the invention includes the light emitting device according to the aspect of the invention described above, a light modulation device adapted to modulate the light emitted from the light emitting device in accordance with image information, and a projection device adapted to project the image formed by the light modulation device.

According to such a projector as described above, the light emitting device capable of inhibiting the light output from degrading due to the saturation of the gain can be included.

A super-luminescent diode according to another aspect of the invention includes a laminated body having an active layer adapted to generate light in response to injection of a current, a first cladding layer and a second cladding layer sandwiching the active layer, a first electrode electrically connected to the first cladding layer, and a second electrode, a third electrode, and a fourth electrode electrically connected to the second cladding layer, the active layer constitutes an optical waveguide adapted to guide the light, the optical waveguide includes a first portion having a belt-like shape connecting a first exit section disposed on a first side surface of the active layer and a first reflecting section disposed on a second side surface of the active layer to each other, a second portion having a belt-like shape connecting the first reflecting section and a second reflecting section disposed on a third side surface of the active layer to each other, and a third portion having a belt-like shape connecting the second reflecting section and a second exit section disposed on the first side surface to each other, a current is injected into the first portion by the first electrode and the second electrode, a current is injected into the second portion by the first electrode and the third electrode, a current is injected into the third portion by the first electrode and the fourth electrode, and a current density of the current injected into the first portion by the first electrode and the second electrode, and a current density of the current is injected into the third portion by the first electrode and the fourth electrode are higher than a current density of the current is injected into the second portion by the first electrode and the third electrode.

According to such a super-luminescent diode as described above, the light output can be inhibited from degrading due to the saturation of the gain. Further, according to such a super-luminescent diode as described above, the distance between the first exit section and the second exit section can be adjusted using the second portion without increasing the size in the direction perpendicular to the first side surface. Thus, in the case of using such a super-luminescent diode as described above as the light source of a projector, the distance between the first exit section and the second exit section can easily be adjusted in accordance with, for example, the size of the microlenses (the lens array).

A projector according to another aspect of the invention includes the super-luminescent diode according to the aspect of the invention described above, a light modulation device adapted to modulate the light emitted from the super-luminescent diode in accordance with image information, and a projection device adapted to project the image formed by the light modulation device.

According to such a projector as described above, the super-luminescent diode capable of inhibiting the light output from degrading due to the saturation of the gain can be included.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, some preferred embodiments of the invention will be explained in detail with reference to the accompanying drawings. It should be noted that the embodiments described below do not unreasonably limit the contents of the invention as set forth in the appended claims. Further, all of the constituents explained hereinafter are not necessarily essential elements of the invention.

1. First Embodiment 1.1. Light Emitting Device

Figure 1:
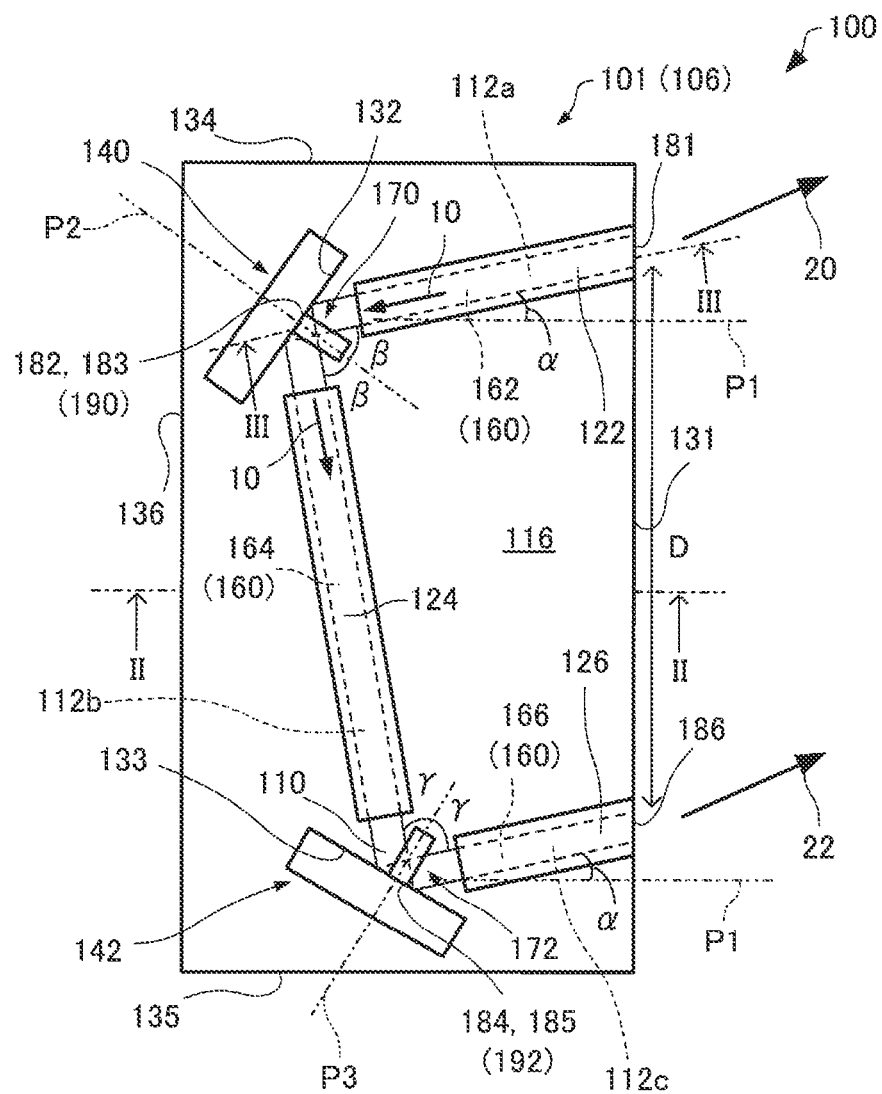
FIG. 1 is a plan view schematically showing a light emitting device according to a first embodiment of the invention.
Figure 2:
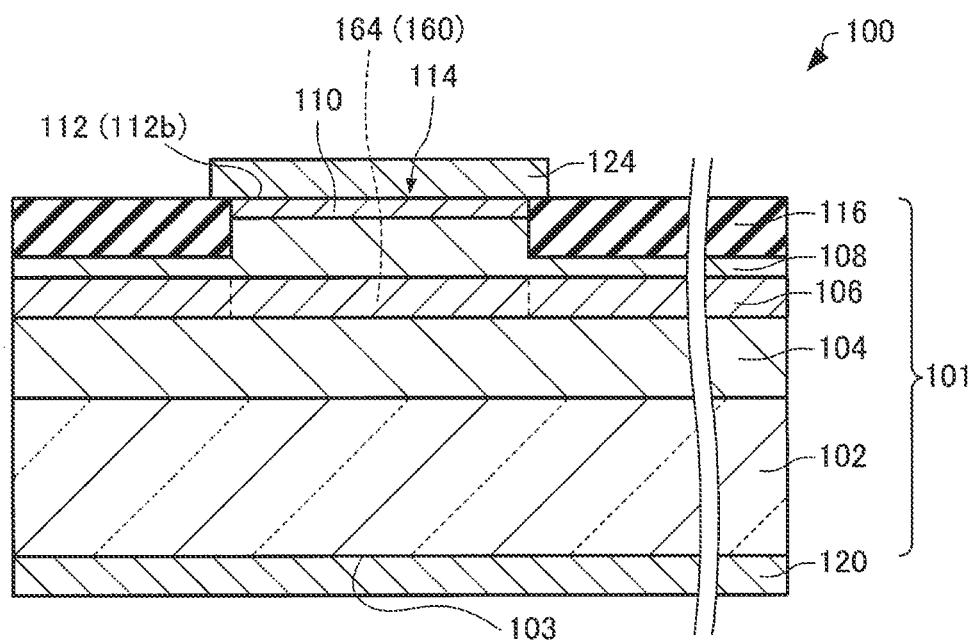
FIG. 2 is a cross-sectional view schematically showing the light emitting device according to the first embodiment.
Figure 3:
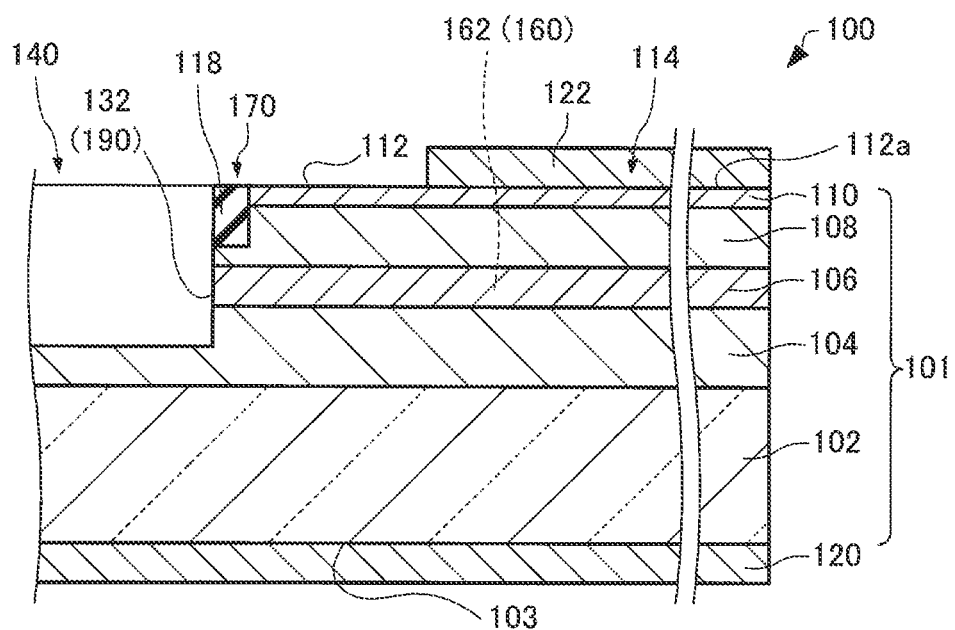
FIG. 3 is a cross-sectional view schematically showing the light emitting device according to the first embodiment.

Firstly, a light emitting device according to a first embodiment will be explained with reference to the accompanying drawings. FIG. 1 is a plan view schematically showing the light emitting device 100 according to the first embodiment. FIG. 2 is a cross-sectional view along the line II-II shown in FIG. 1, and schematically shows the light emitting device 100 according to the first embodiment. FIG. 3 is a cross-sectional view along the line III-III shown in FIG. 1, and schematically shows the light emitting device 100 according to the first embodiment.

The case in which the light emitting device 100 is an SLD of the InGaAlP type (red) will be explained below. Unlike the semiconductor laser, in the SLD, the laser oscillation can be prevented by suppressing formation of the resonator due to the end surface reflection. Therefore, the speckle noise can be reduced.

As shown in FIGS. 1 to 3, the light emitting device 100 includes a laminated body 101, a first electrode 120, a second electrode 122, a third electrode 124, and a fourth electrode 126. Further, the light emitting device 100 can include insulating layers 116, 118.

The laminated body 101 can be provided with a substrate 102, a first cladding layer 104, an active layer 106, a second cladding layer 108, and a contact layer 110. In the example shown in the drawings, the planar shape (the shape of the laminated body 101 viewed from the stacking direction) of the laminated body 101 is a rectangular shape.

The substrate 102 is, for example, a first conductivity type (e.g., an n-type) GaAs substrate.

The first cladding layer 104 is formed on the substrate 102. The first cladding layer 104 is, for example, an n-type InGaAlP layer. It should be noted that although not shown in the drawings, it is also possible to form a buffer layer between the substrate 102 and the first cladding layer 104. The buffer layer is, for example, an n-type GaAs layer, an n-type AlGaAs layer, or an n-type InGaP layer. The buffer layer is capable of improving the crystallinity of the layer to be formed above the buffer layer.

The active layer 106 is formed on the first cladding layer 104. The active layer 106 has, for example, a multiple quantum well (MQW) structure having three quantum well structures stacked one another each formed of an InGaP well layer and an InGaAlP barrier layer.

The planar shape of the active layer 106 is the same as, for example, the planar shape of the laminated body 101. As shown in FIG. 1, the active layer 106 includes a first side surface 131, a second side surface 132, a third side surface 133, a fourth side surface 134, a fifth side surface 135, and a sixth side surface 136. The side surfaces 131 through 136 are surfaces not having surface contact with the first cladding layer 104 or the second cladding layer 108 among the surfaces of the active layer 106. The side surfaces 131 through 136 are each, for example, a flat surface.

The side surfaces 132, 133 of the active layer 106 are tilted with respect to the side surface 131. In the example shown in the drawings, the side surfaces 134, 135 are perpendicular to the side surfaces 131, 136. The side surface 136 is opposed to the side surface 131. The side surfaces 131, and 134 through 136 are each, for example, a cleaved surface formed by cleavage.

The second side surface 132 of the active layer 106 is formed by providing a first opening section 140 to the laminated body 101. The third side surface 133 is formed by providing a second opening section 142 to the laminated body 101. In other words, the side surfaces 132, 133 are surfaces of the active layer 106 defining the opening sections 140, 142, respectively. The opening sections 140, 142 are formed by, for example, performing an etching process. In other words, the side surfaces 132, 133 are each an etching surface formed by etching. The opening sections 140, 142 reach the first cladding layer 104. In other words, bottom surfaces of the opening sections 140, 142 are defined by the surface of the first cladding layer 104. It should be noted that although not shown in the drawings, it is also possible for the opening sections 140, 142 to reach the substrate 102. In this case, it can be said that the bottom surfaces of the opening sections 140, 142 are defined by the surface of the substrate 102.

It should be noted that although not shown in the drawings, it is also possible for the opening sections 140, 142 to be filled with an insulating layer. The insulating layer can be, for example, an SiN layer, an SiO$_2$ layer, an SiON layer, an Al$_2$O$_3$ layer, or a polyimide layer.

A part of the active layer 106 constitutes an optical waveguide 160. The optical waveguide 160 can guide the light. In the example shown in the drawings, the optical waveguide 160 includes portions overlapping the electrode 122, 124, or 126 viewed from the stacking direction of the laminated body 101 (hereinafter also referred to as "in a plan view"), and portions not overlapping any of the electrodes 122, 124, and 126. The portions of the optical waveguide 160 overlapping the electrode 122, 124, or 126 are the portions to which currents are injected by the electrode 120, and the electrodes 122, 124, and 126, respectively.

The portions of the optical waveguide 160 to which the currents are injected are capable of generating light. The light guided through the optical waveguide 160 can be provided with a gain in the portions of the optical waveguide 160 to which the currents are injected. Specifically, the portions of the optical waveguide 160, to which the currents are injected, are the portions located between a contact surface 103 and contact surfaces 112a, 112b, and 112c, respectively, wherein the substrate 102 and the first electrode 120 have contact with each other on the contact surface 103, and the contact layer 110 and the electrodes 112, 124, and 126 have contact with each other on the contact surfaces 112a, 112b, and 112c, respectively.

As shown in FIG. 1, the optical waveguide 160 has a first portion 162, a second portion 164, and a third portion 166.

The first portion 162 extends from the first side surface 131 to the second side surface 132 in the plan view. In other words, the first portion 162 connects the first side surface 131 and the second side surface 132 to each other in the plan view. In the plan view, the first portion 162 has a predetermined width, and has a belt-like and linear longitudinal shape along the extending direction of the first portion 162. The first portion 162 has a first end surface 181 provided to the connection section with the first side surface 131 and a second end surface 182 provided to the connection section with the second side surface 132. The first end surface 181 can function as an exit section.

It should be noted that the extending direction of the first portion 162 denotes, for example, the extending direction of a straight line passing through the center of the first end surface 181 and the center of the second end surface 182 in the plane view. Further, the extending direction of the first portion 162 can also be the extending direction of a boundary line of the first portion 162 (with an area except the first portion 162). Similarly, also in other portions of the optical waveguide 160, the extending direction denotes, for example, the extending direction of a straight line passing through the centers of two end surfaces in the plan view. Further, the extending direction can also be the extending direction of a boundary line of the other portion (with an area except the other portion).

The first portion 162 is connected to the first side surface 131 while tilted at an angle α with the perpendicular P1 of the first side surface 131 in the plan view. In other words, it can be said that the extending direction of the first portion 162 has the angle α with the perpendicular P1. The angle α is an acute angle larger than 0°, and is smaller than the critical angle.

The first portion 162 is connected to the second side surface 132 while tilted at an angle β with the perpendicular P2 of the second side surface 132 in the plan view. In other words, it can be said that the extending direction of the first portion 162 has the angle β with the perpendicular P2.

The second portion 164 extends from the second side surface 132 to the third side surface 133 in the plan view. In other words, the second portion 164 connects the second side surface 132 and the third side surface 133 to each other in the plan view. In the plan view, the second portion 164 has a predetermined width, and has a belt-like and linear longitudinal shape along the extending direction of the second portion 164. The second portion 164 has a third end surface 183 provided to the connection section with the second side surface 132 and a fourth end surface 184 provided to the connection section with the third side surface 133. The extending direction of the second portion 164 is tilted with respect to the first side surface 131 in the plan view in the example shown in the drawings, but can also be parallel to the first side surface 131.

The third end surface 183 of the second portion 164 overlaps the second end surface 182 of the first portion 162 on the second side surface 132. In the example shown in the drawings, the second end surface 182 and the third end surface 183 completely overlap each other in an overlapping plane 190.

The second portion 164 is connected to the second side surface 132 while tilted at the angle β with the perpendicular P2 of the second side surface 132 in the plan view. In other words, it can be said that the extending direction of the second portion 164 has the angle β with the perpendicular P2. That is, the angle of the first portion 162 with respect to the perpendicular P2 and the angle of the second portion 164 with respect to the perpendicular P2 are equivalent to each other within the range of the production tolerance. The angle β is, for example, an acute angle, and is equal to or larger than the critical angle. Thus, the second side surface 132 can totally reflect the light generated in the optical waveguide 160.

It should be noted that the sentence "one angle and another angle are equivalent to each other within the production tolerance" denotes that the difference between the angles is within, for example, ±2° taking the production tolerance such as etching into consideration.

The second portion 164 is connected to the third side surface 133 while tilted at an angle γ with the perpendicular P3 of the third side surface 133 in the plan view. In other words, it can be said that the extending direction of the second portion 164 has the angle γ with the perpendicular P3.

The length of the second portion 164 in the extending direction is larger than the length of the first portion 162 in the extending direction, and the length of the third portion 166 in the extending direction. The length of the second portion 164 in the extending direction can also be equal to or greater than the sum of the length of the first portion 162 in the extending direction and the length of the third portion 166 in the extending direction.

It should be noted that "the length of the second portion 164 in the extending direction" can also be said to be the distance between the center of the third end surface 183 and the center of the fourth end surface 184. Regarding other portions, it can also be said that the length in the extending direction is the distance between the centers of the two end surfaces in a similar manner.

The third portion 166 extends from the third side surface 133 to the first side surface 131 in the plan view. In other words, the third portion 166 connects the third side surface 133 and the first side surface 131 to each other in the plan view. In the plan view, the third portion 166 has, for example, a predetermined width, and has a belt-like and linear longitudinal shape along the extending direction of the third portion 166. The third portion 166 has a fifth end surface 185 provided to the connection section with the third side surface 133 and a sixth end surface 186 provided to the connection section with the first side surface 131. The sixth end surface 186 can function as the exit section.

The fifth end surface 185 of the third portion 166 overlaps the fourth end surface 184 of the second portion 164 on the third side surface 133. In the example shown in the drawing, the fourth end surface 184 and the fifth end surface 185 completely overlap each other on an overlapping plane 192.

The third portion 166 is separated from the first portion 162. In the example shown in FIG. 1, the first end surface 181 of the first portion 162 and the sixth end surface 186 of the third portion 166 are distant from each other with a distance D. The distance D is appropriately determined in accordance with the size of the microlenses (lens array) to which the lights 20, 22 emitted respectively from the end surfaces 181, 186 are input, and is, for example, no smaller than several hundreds of micrometers and no larger than 5 mm. More specifically, the distance D is about 2 mm. It should be noted that the total length (the length in the extending direction) of the optical waveguide 160 is, for example, about 4 mm.

The third portion 166 is connected to the third side surface 133 while tilted at the angle γ with the perpendicular P3 of the third side surface 133 in the plan view. In other words, it can be said that the extending direction of the third portion 166 has the angle γ with the perpendicular P3. That is, the angle of the second portion 164 with respect to the perpendicular P3 and the angle of the third portion 166 with respect to the perpendicular P3 are equivalent to each other within the range of the production tolerance. The angle γ is, for example, an acute angle, and is equal to or larger than the critical angle.

Thus, the third side surface 133 can totally reflect the light generated in the optical waveguide 160.

The third portion 166 is connected to the first side surface 131 while tilted at an angle α with the perpendicular P1 in the plan view. In other words, it can be said that the longitudinal direction of the third portion 166 has the angle α with the perpendicular P1. In other words, the first portion 162 and the third portion 166 are connected to the first side surface 131 in the same direction, and are parallel to each other in the plan view. More specifically, the extending direction of the first portion 162 and the extending direction of the third portion 166 are parallel to each other. Thus, the light 20 emitted from the first end surface 181 and the light 22 emitted from the sixth end surface 186 can be emitted in the same direction. It should be noted that the extending direction of the first portion 162 and the extending direction of the third portion 166 are not required to be parallel to each other.

It should be noted that the sentence "the extending direction of the first portion 162 and the extending direction of the third portion 166 are parallel to each other" denotes that the tilt angle of the extending direction of the third portion 166 with respect to the extending direction of the first portion 162 is within ±1° in the plan view taking the production tolerance or the like into consideration.

As described above, by setting the angles β, γ to be equal to or larger than the critical angle, and setting the angle α to be smaller than the critical angle, the reflectance of the first side surface 131 can be made lower than the reflectance of the second side surface 132 and the reflectance of the third side surface 133 with respect to the light generated in the optical waveguide 160. In other words, the first end surface 181 provided to the first side surface 131 becomes a first exit section (a first exit section 181) for emitting the light generated in the optical waveguide 160. The sixth end surface 186 provided to the first side surface 131 becomes a second exit section (a second exit section 186) for emitting the light generated in the optical waveguide 160. The overlapping plane 190 between the end surfaces 182, 183 provided to the second side surface 132 becomes a first reflecting section (a first reflecting section 190) for reflecting the light generated in the optical waveguide 160. The overlapping plane 192 between the end surfaces 184, 185 provided to the third side surface 133 becomes a second reflecting section (a second reflecting section 192) for reflecting the light generated in the optical waveguide 160.

In other words, the first portion 162 extends (connects the first exit section 181 and the first reflecting section 190 to each other) from the first exit section 181 provided to the first side surface 131 to the first reflecting section 190 provided to the second side surface 132. The second portion 164 extends (connects the first reflecting section 190 and the second reflecting section 192 to each other) from the first reflecting section 190 to the second reflecting section 192 provided to the third side surface 133. The third portion 166 extends (connects the second reflecting section 192 and the second exit section 186 to each other) from the second reflecting section 192 to the second exit section 186 provided to the first side surface 131. As shown in FIG. 1, it can be said that the optical waveguide 160 has a bracket shape (a U shape with corners) in the plan view. In the example shown in the drawings, the width (the size in a direction perpendicular to the extending direction) of the first portion 162, the width of the second portion 164, and the width of the third portion 166 are the same, and therefore, the width of the optical waveguide 160 is constant.

In other words, the optical waveguide 160 connects the first exit section 181 and the second exit section 186 to each other, and the proceeding direction of the light guided by the optical waveguide 160 is changed in the reflecting sections 190, 192. Therefore, it can be said that the first reflecting section 190 is a first inflecting section at which the proceeding direction of the light guided by the optical waveguide 160 is changed, and the second reflecting section 192 is a second inflecting section at which the proceeding direction of the light guided by the optical waveguide 160 is changed.

Further, it can be said that the first portion 162 is an optical waveguide located between the first exit section 181 and the first reflecting section (the first inflecting section) 190, the second portion 164 is an optical waveguide located between the first reflecting section (the first inflecting section) 190 and the second reflecting section (the second inflecting section) 192, and the third portion 166 is an optical waveguide located between the second exit section 186 and the second reflecting section (the second inflecting section) 192.

It should be noted that although in the example shown in the drawings, the surfaces of the exit sections 181, 186 and the reflecting sections 190, 192 are exposed, it is also possible, for example, to cover the first side surface 131 with an antireflection film (not shown), and to cover the second side surface 132 and the third side surface 133 with a reflecting film (not shown). Thus, even under the condition of the incident angle, the refractive index, and so on with which the light generated in the optical waveguide 160 is not totally reflected by the reflecting sections 190, 192, it is possible to make the reflectance of the first side surface 131 in the wavelength band of the light generated in the optical waveguide 160 lower than the reflectance of the second side surface 132 and the reflectance of the third side surface 133. Further, by covering the first side surface 131 with the antireflection film, it can be reduced to multiply-reflect the light generated in the optical waveguide 160 directly between the first end surface 181 and the sixth end surface 186. As a result, it can be prevented to constitute a direct resonator, and thus, the laser oscillation of the light generated in the optical waveguide 160 can be suppressed.

As the reflecting film and the antireflection film, for example, an $SiO_2$ layer, a $Ta_2O_5$ layer, an $Al_2O_3$ layer, a TiN layer, a $TiO_2$ layer, an SiON layer, an SiN layer, or a multilayer film of any of these layers is used. Further, it is also possible to adopt a distributed Bragg reflector (DBR) formed by etching each of the side surfaces 132, 133 to thereby obtain a high reflectance.

As shown in FIGS. 2 and 3, the second cladding layer 108 is formed on the active layer 106. In other words, the first cladding layer 104 and the second cladding layer 108 sandwich the active layer 106 in between. The second cladding layer 108 is, for example, a second conductive type (e.g., a p-type) InGaAlP layer.

For example, a pin diode is constituted by the p-type second cladding layer 108, the active layer 106 with no impurity doped, and the n-type first cladding layer 104. Each of the first cladding layer 104 and the second cladding layer 108 is a layer having a forbidden-band width larger than that of the active layer 106, and a refractive index smaller than that of the active layer 106. The active layer 106 has a function of generating light in response to the injection of the current with the electrodes 120, 122, 124, and 126, and then wave-guiding the light while amplifying the light. The first cladding layer 104 and the second cladding layer 108 have a function (a function of suppressing the leakage of light) of sandwiching the active layer 106 to thereby confine injected carriers (electrons and holes) and the light therein.

In the light emitting device 100, when applying (injecting the current) a forward bias voltage of the pin diode between the first electrode 122 and each of the electrodes 122, 124, and 126, the optical waveguide 160 is formed in the active layer 106, and recombination of the electron and the hole occurs in the optical waveguide 106. The recombination causes emission of light. The stimulated emission begins at the light thus generated in a chained manner, and the light intensity is amplified inside a part of the optical waveguide 160 to which the current is injected. The optical waveguide 160 is constituted by, for example, the active layer 106 and the cladding layers 104, 108.

For example, as shown in FIG. 1, the light 10 generated in the first portion 162 of the optical waveguide 160 and proceeding toward the second side surface 132 is amplified in the part of the first portion 162 to which the current is injected, and is then reflected by the first reflecting section 190, and then proceeds through the second portion 164 toward the third side surface 133. Then, the light 10 is further reflected by the second reflecting section 192, then proceeds through the third portion 166, and is then emitted from the second exit section 186 as light 22. On this occasion, the light intensity is also amplified in parts of the second portion 164 and the third portion 166 to which the currents are respectively injected.

Similarly, the light generated in the third portion 166 and proceeding toward the third side surface 133 is amplified in a part of the third portion 166 to which the current is injected, and is then reflected by the second reflecting section 192, and then proceeds through the second portion 164 toward the second side surface 132. Then, the light is further reflected by the first reflecting section 190, then proceeds through the first portion 162, and is then emitted from the first exit section 181 as light 20. On this occasion, the light intensity is also amplified in parts of the first portion 162 and the second portion 164 to which the currents are respectively injected.

It should be noted that some of the light generated in the first portion 162 is emitted directly from the first exit section 181 as the light 20. Similarly, some of the light generated in the third portion 166 is emitted directly from the second exit section 186 as the light 22. The intensity of each of these lights described above is also amplified in parts of the first portion 162 and the third portion 166 to which the currents are respectively injected.

As shown in FIGS. 2 and 3, the contact layer 110 is formed on the second cladding layer 108. The contact layer 110 can have ohmic contact with the electrodes 122, 124, and 126. An upper surface 112 of the contact layer 110 includes a first contact surface (a first contact surface of the laminated body 101 with the second electrode 122) 112a, a second contact surface (a second contact surface of the laminated body 101 with the third electrode 124) 112b, and a third contact surface (a third contact surface of the laminated body 101 with the fourth electrode 126) 112c. The first contact surface 112a can be said to be a first contact section where the second electrode 122 and the laminated body 101 have electrical contact with each other. The second contact surface 112b can be said to be a second contact section where the third electrode 124 and the laminated body 101 have electrical contact with each other. The third contact surface 112c can be said to be a third contact section where the fourth electrode 126 and the laminated body 101 have electrical contact with each other. The contact layer 110 is, for example, a p-type GaAs layer.

The contact surfaces 112a, 112b, and 112c of the contact layer 110 are separated from the reflecting sections 190, 192 in the plan view. In other words, the part (the part located between the electrodes 120, 122) of the first portion 162 to which the current is injected, the part (the part located between the electrodes 120, 124) of the second portion 164 to which the current is injected, and the part (the part located between the electrodes 120, 126) of the third portion 166 to which the current is injected are separated from the reflecting sections 190, 192. In the example shown in the drawings, the electrodes 122, 124, and 126 are separated from the reflecting sections 190, 192 in the plan view.

The contact layer 110 and a part of the second cladding layer 108 constitute a columnar section 114. The planar shape of the columnar section 114 is the same as, for example, the planar shape of the optical waveguide 160. For example, the current channel between the electrode 120 and the electrodes 122, 124, and 126 is determined by the planar shape of the columnar section 114, and as a result, the planar shape of the optical waveguide 160 is determined. It should be noted that although not shown in the drawings, the side surfaces of the columnar section 114 can be tilted.

The laminated body 101 can include a first groove section 170 and a second groove section 172. More specifically, the groove sections 170, 172 are formed in the contact layer 110 and the second cladding layer 108. In other words, the groove sections 170, 172 penetrate the contact layer 110 to reach the second cladding layer 108, and bottom surfaces of the groove sections 170, 172 are defined by a surface of the second cladding layer 108. It should be noted that although not shown in the drawings, the groove sections 170, 172 are not required to reach the second cladding layer 108, and the bottom surfaces of the groove sections 170, 172 can also be defined by a surface of the contact layer 110. Further, it is also possible that the groove sections 170, 172 penetrate the second cladding layer 108, and the bottom surfaces of the groove sections 170, 172 are defined by the upper surface of the active layer 106.

The first groove section 170 is disposed at a position overlapping the optical waveguide 160, and between the first contact surface 112a and the second contact surface 112b in the plan view. More specifically, the first groove section 170 is disposed between the first contact surface 112a and the second contact surface 112b in the extending direction (a propagation direction of the light) of the optical waveguide 160 in the plan view. The first groove 170 can be disposed at a position overlapping the first portion 162 and the second portion 164 in the plan view so as to be continuous with the first opening section 140 as shown in FIG. 3. It should be noted that although not shown in the drawings, the first groove 170 can be disposed at a position overlapping only the first portion 162, or a position overlapping only the second portion 164 in the plan view.

Similarly, the second groove section 172 is disposed at a position overlapping the optical waveguide 160, and between the second contact surface 112b and the third contact surface 112c in the plan view. More specifically, the second groove section 172 is disposed between the second contact surface 112b and the third contact surface 112c in the extending direction of the optical waveguide 160 in the plan view. The second groove 172 can be disposed at a position overlapping the second portion 164 and the third portion 166 in the plan view so as to be connected to the second opening section 142. It should be noted that although not shown in the drawings, the second groove 172 can be disposed at a position overlapping only the second portion 164, or a position overlapping only the third portion 166 in the plan view.

The planar shapes of the first groove section 170 and the second groove section 172 are not particularly limited, but are each a rectangular shape in the example shown in FIG. 1. The size of each of the groove sections 170, 172 in the extending direction of the optical waveguide 160 is, for example, equal to or larger than a half of the thickness of the second cladding layer 108, and is sufficiently smaller than the total length of the optical waveguide 160. Specifically, the size is no smaller than 250 nm and no larger than 500 µm. Since the sizes of the groove sections 170, 172 in the extending direction are small as described above, the light can be guided in the optical waveguide 160 while being hardly affected by the groove sections 170, 172.

It should be noted that as shown in FIG. 3, the groove sections 170, 172 can be filled with the insulating layer 118. The insulating layer 118 can be, for example, an SiN layer, an $SiO_2$ layer, an SiON layer, an $Al_2O_3$ layer, or a polyimide layer.

As shown in FIG. 2, the insulating layer 116 is formed on the second cladding layer 108, and on the lateral side of the columnar section 114 (in the periphery of the columnar section 114 in the plan view). The insulating layer 116 has contact with the side surfaces of the columnar section 114. The upper surface of the insulating layer 116 is continuous with, for example, the upper surface 112 of the contact layer 110.

The insulating layer 116 is, for example, an SiN layer, an $SiO_2$ layer, an SiON layer, an $Al_2O_3$ layer, or a polyimide layer. In the case of using the materials described above as the insulating layer 116, the currents between the electrode 120 and the electrodes 122, 124, and 126 can flow through the columnar section 114 sandwiched between the electrode 120 and the electrodes 122, 124, and 126 while avoiding the insulating layer 116.

The insulating layer 116 can be provided with a refractive index lower than the refractive index of the second cladding layer 108. In this case, the effective refractive index of the vertical cross-section of the portion to which the insulating layer 116 is provided becomes lower than the effective refractive index of the vertical cross-section of the portion to which the insulating layer 116 is not provided, namely the portion to which the columnar section 114 is provided. Thus, in the horizontal direction (the direction perpendicular to the vertical direction), it becomes possible to efficiently confine the light inside the optical waveguide 160. It should be noted that although not shown in the drawings, the insulating layer 116 is not required to be provided. In other words, the insulating layer can also be an air space.

The first electrode 120 is formed on the entire bottom surface of the substrate 102. More specifically, the first electrode 120 is formed so as to have contact with a lower surface 103 of a layer (the substrate 102 in the example shown in the drawings) having ohmic contact with the first electrode 120. The first electrode 120 is electrically connected to the first cladding layer 104 via the substrate 102. The first electrode 120 is one of the electrodes for driving the light emitting device 100. As the first electrode 120, there is used, for example, what is obtained by stacking a Cr layer, an AuGe layer, an Ni layer, and an Au layer in this order from the substrate 102 side.

It should be noted that it is also possible to dispose a second contact layer (not shown) between the first cladding layer 104 and the substrate 102, expose the second contact layer to the opposite side to the substrate 102 using, for example, a dry etching process from the opposite side to the substrate 102, and then dispose the first electrode 120 on the second contact layer. Thus, a single-sided electrode structure can be obtained. This configuration is particularly effective in the case in which the substrate 102 has an insulation property.

The second electrode 122 is formed on the contact layer 110 at a position overlapping the first portion 162 in the plan view. The second electrode 122 has a shape extending along the first portion 162. The second electrode 122 is an electrode having the smallest distance from the first exit section 181 among the electrodes 122, 124, and 126 in the extending direction of the optical waveguide 160. The first portion 162 includes a part overlapping the second electrode 122 and a part not overlapping the second electrode 122 in the plan view. The electrodes 120, 122 inject the current into the part of the first portion 162 overlapping the second electrode 122. The size (the size in the extending direction of the first portion 162) of the part of the first portion 162 not overlapping the second electrode 122 is sufficiently smaller than the size (the size in the extending direction of the first portion 162) of the part of the first portion 162 overlapping the second electrode 122. Therefore, the first portion 162 is capable of guiding the light also in the part not overlapping the second electrode 122.

The third electrode 124 is formed on the contact layer 110 at a position overlapping the second portion 164 in the plan view. The third electrode 124 has a shape extending along the second portion 164. The third electrode 124 is an electrode located between the second electrode 122 and the fourth electrode 126 in the extending direction of the optical waveguide 160. The second portion 164 includes a part overlapping the third electrode 124 and a part not overlapping the third electrode 124 in the plan view. The electrodes 120, 124 inject the current into the part of the second portion 164 overlapping the third electrode 124. The size (the size in the extending direction of the second portion 164) of the part of the second portion 164 not overlapping the third electrode 124 is sufficiently smaller than the size (the size in the extending direction of the second portion 164) of the part of the second portion 164 overlapping the third electrode 124. Therefore, the second portion 164 is capable of guiding the light also in the part not overlapping the third electrode 124.

The fourth electrode 126 is formed on the contact layer 110 at a position overlapping the third portion 166 in the plan view. The fourth electrode 126 has a shape extending along the third portion 166. The fourth electrode 126 is an electrode having the smallest distance from the second exit section 186 among the electrodes 122, 124, and 126 in the extending direction of the optical waveguide 160. The third portion 166 includes a part overlapping the fourth electrode 126 and a part not overlapping the fourth electrode 126 in the plan view. The electrodes 120, 126 inject the current into the part of the third portion 166 overlapping the fourth electrode 126. The size (the size in the extending direction of the third portion 166) of the part of the third portion 166 not overlapping the fourth electrode 126 is sufficiently smaller than the size (the size in the extending direction of the third portion 166) of the part of the third portion 166 overlapping the fourth electrode 126. Therefore, the third portion 166 is capable of guiding the light also in the part not overlapping the fourth electrode 126.

Specifically, the size of the part of the first portion 162 not overlapping the second electrode 122, the size of the part of the second portion 164 not overlapping the third electrode 124, and the size of the part of the third portion 166 not overlapping the fourth electrode 126 are each, for example, no smaller than 250 nm and no larger than 500 μm.

The second electrode 122, the third electrode 124, and the fourth electrode 126 are separated from each other. In other words, it can be said that the electrode formed on the contact layer 110 is divided into a plurality of segments. More specifically, the electrode formed on the contact layer 110 is divided so as not to have contact with the reflecting sections 190, 192 in the plan view.

The current density of the current injected into the first portion 162 by the first electrode 120 and the second electrode 122, and the current density of the current injected into the third portion 166 by the first electrode 120 and the fourth electrode 126 are higher than the current density of the current injected into the second portion 164 by the first electrode 120 and the third electrode 124. Here, the "current density" denotes the quantity of electricity (the charge, namely the carrier) flowing in a direction perpendicular to the unit area per unit time. Therefore, the carrier density in the first portion 162 to which the carriers are injected by the electrodes 120, 122 and the carrier density in the third portion 166 to which the carriers are injected by the electrodes 120, 126 are higher than the carrier density in the second portion 164 to which the carriers are injected by the electrodes 120, 124.

The second electrode 122, the third electrode 124, and the fourth electrode 126 are electrically connected to the second cladding layer 108 via the contact layer 110. The electrodes 122, 124, and 126 are each the other of the electrodes for driving the light emitting device 100. As the electrodes 122, 124, and 126, there can be used, for example, what is obtained by stacking a Cr layer, an AuZn layer, and an Au layer in this order from the contact layer 110 side.

It should be noted that although in the example shown in FIG. 1, the electrodes 122, 124, and 126 each have the shape extending along the respective portions 162, 164, and 166 of the optical waveguide 160, and are separated from each other, it is also possible for the second electrode 122 and the fourth electrode 126 to be connected to each other so as to be continuous with each other.

Further, the second electrode 122 and the fourth electrode 126 can also be equipotent to each other. In other words, the electrodes 122, 126 can also be electrically connected to each other with wiring (not shown), or electrically connected to separated power supplies (not shown) to be set equipotent to each other by the respective power supplies.

Although the case with the InGaAlP type is explained hereinabove as the light emitting device 100 according to the first embodiment, any material type capable of forming the optical waveguide can be used in the light emitting device according to the invention. In the case of semiconductor materials, semiconductor materials such as an AlGaN type, a GaN type, an InGaN type, a GaAs type, an AlGaAs type, an InGaAs type, an InGaAsP type, an InP type, a GaP type, an AlGaP type, a ZnCdSe type can be used.

Further, the explanation is presented above assuming that the light emitting device 100 according to the first embodiment is a so-called index-guiding type in which a refractive index difference is provided between the region where the insulating layer 116 is formed and the region where the insulating layer 116 is not formed, namely the region where the columnar section 114 is formed, to thereby confine the light. Although not shown in the drawings, the light emitting device according to the invention can be a so-called gain-guiding type in which the refractive index difference is not provided by forming the columnar section 114, and the optical waveguide 160 directly forms the waveguide region.

Further, although there is hereinabove explained an example of the light emitting device 100 according to the first embodiment in which the plurality of electrodes 122, 124, and 126 electrically connected to the second cladding layer 108 are included, and the electrodes 122, 124, and 126 are formed along the optical waveguide 160, it is also possible for the light emitting device according to the invention to include a plurality of electrodes electrically connected to the first cladding layer 104, wherein the electrodes are formed along the optical waveguide 160.

Further, although there is hereinabove explained an example of the light emitting device 100 according to the first embodiment in which the three electrodes 122, 124, and 126 electrically connected to the second cladding layer 108 and disposed along the optical waveguide 160 are included, it is also possible for the light emitting device according to the invention to include four or more electrodes electrically connected to the second cladding layer 108, wherein the four or more electrodes are disposed along the optical waveguide 160 so as to be separated from each other.

The light emitting device 100 according to the first embodiment can be applied to the light source of, for example, a projector, a monitor display, an illumination device, and a measuring device.

The light emitting device 100 has following features, for example.

According to the light emitting device 100, the current density of the current injected into the first portion 162 by the first electrode 120 and the second electrode 122, and the current density of the current injected into the third portion 166 by the first electrode 120 and the fourth electrode 126 are higher than the current density of the current injected into the second portion 164 by the first electrode 120 and the third electrode 124. In other words, the carrier density in the first portion 162 to which the carriers are injected by the electrodes 120, 122 and the carrier density in the third portion 166 to which the carriers are injected by the electrodes 120, 126 are higher than the carrier density in the second portion 164 to which the carriers are injected by the electrodes 120, 124. Further, the first portion 162 and the third portion 166 are respectively provided with the exit sections 181, 186. Therefore, in the light emitting device 100, the light output can be inhibited from degrading due to the saturation of the gain. Hereinafter, the reason therefor will specifically be explained.

Figure 4A:
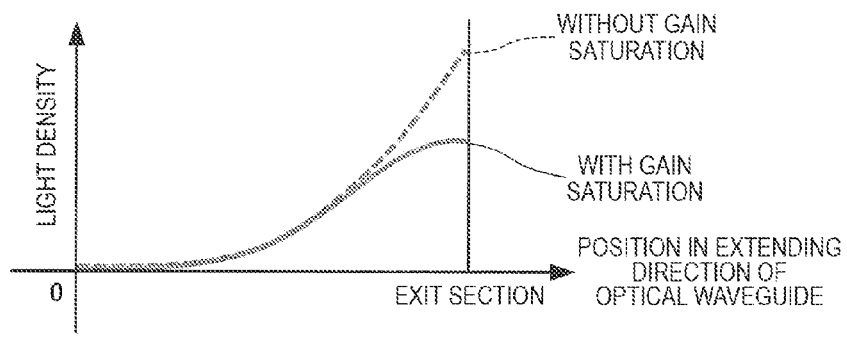
FIGS. 4A and 4B are graphs schematically showing a relationship between a position in the extending direction of an optical waveguide and light density, and a relationship between the position and injection current density, respectively.
Figure 4B:
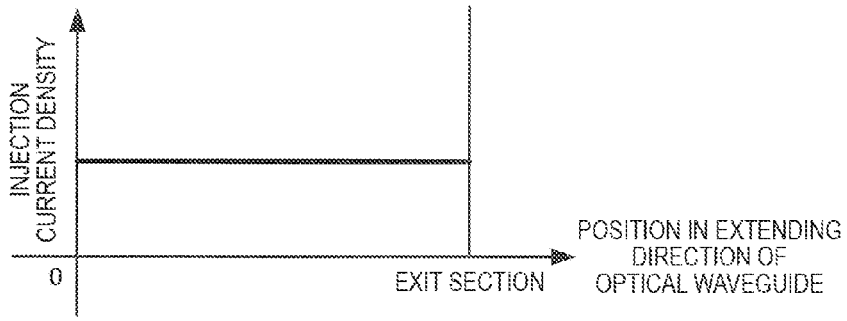
Figure 5A:
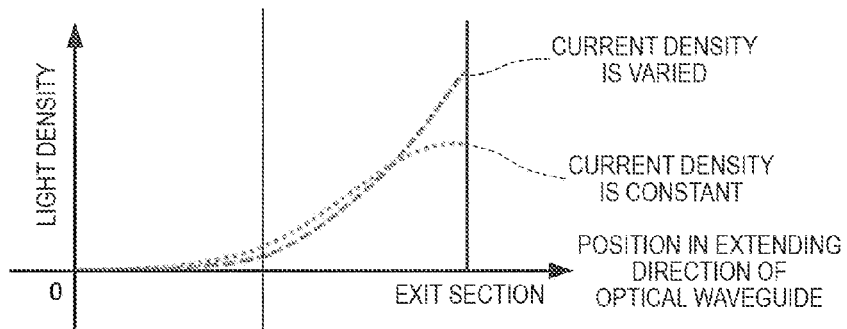
FIGS. 5A and 5B are graphs schematically showing the relationship between the position in the extending direction of the optical waveguide and the light density, and the relationship between the position and the injection current density, respectively.
Figure 5B:
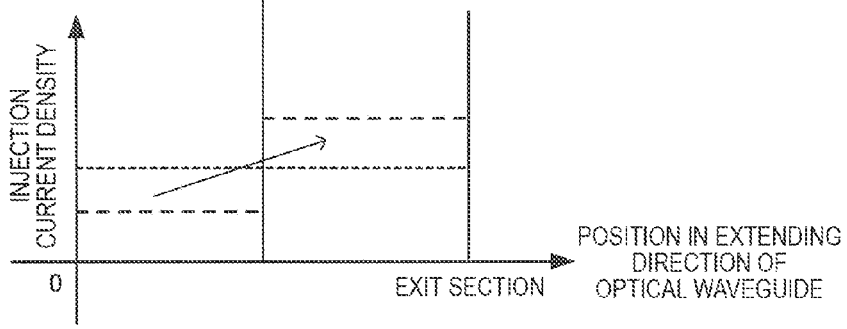

FIGS. 4A and 5A are graphs schematically showing a relationship between the position in the extending direction of the optical waveguide and the light density. FIGS. 4B and 5B are graphs schematically showing a relationship between the position in the extending direction of the optical waveguide and the injection current density. FIGS. 4A and 4B show the case in which the injection current density in the extending direction of the optical waveguide is constant, and FIGS. 5A and 5B show the case in which the injection current density in the extending direction of the optical waveguide is varied. Here, the "light density" denotes the number of photons passing through a cross-sectional surface perpendicular to the extending direction of the optical waveguide per unit time at a certain position in the extending direction of the optical waveguide.

It should be noted that in FIGS. 4A, 4B, 5A, and 5B, the optical waveguide with a constant width (the size of the optical waveguide in a direction perpendicular to the extending direction thereof) is assumed. Further, in FIGS. 4A, 4B, 5A, and 5B, only the light proceeding from the position 0 on the horizontal axis toward the arrow direction is considered.

In the SLD, the light is amplified in an exponential manner toward the exit section (the side with smaller reflectance) for emitting the light. Therefore, as shown in FIG. 4A, the light density has an uneven distribution in the extending direction of the optical waveguide, and the saturation of the gain occurs on the exit section side with the higher light density. Therefore, in the case in which the injection current density (i.e., the carrier density) is constant in the extending direction of the optical waveguide, the carriers become insufficient relatively to the light (the photons) on the exit section side. In other words, when the light is to be amplified, the carriers to be converted to the light become insufficient. As a result, the saturation of the gain occurs, and the light output is degraded accordingly.

Here, the part (on the opposite side to the exit section side) with the lower light density is in a state with a larger number of carriers compared to the exit section side, and the carriers are not sufficiently converted into the light, and are partially left unused. As shown in FIGS. 5A and 5B, by injecting such surplus carriers into the exit section side with insufficient carriers, high-output and highly-efficient drive can be performed. In other words, by changing the current density, it is possible to reduce the saturation of the gain to increase the net light output while keeping the amplitude of the injection current in the entire optical waveguide constant.

As described above, in the light emitting device 100, by setting the current density (the carrier density) in the first portion 162 and the third portion 166 having the exit sections 181, 186 to be higher than the current density in the second portion 164, it is possible to inhibit the light output from degrading due to the saturation of the gain while keeping the amplitude of the current to be injected into the entire optical waveguide 160 constant. In other words, in the light emitting device 100, even in the case of setting the amplitude of the current to be injected into the entire optical waveguide 160 to be equal to the amplitude of the current to be injected into the entire optical waveguide with the current density set constant in the extending direction of the optical waveguide, higher output can be achieved. As a result, in the light emitting device 100, the high-output and highly-efficient drive can be performed.

Further, according to the light emitting device 100, the first contact surface 112a of the laminated body 101 with the second electrode 122, the second contact surface 112b of the laminated body 101 with the third electrode 124, and the third contact surface 112c of the laminated body 101 with the fourth electrode 126 are separated from each other in the plan view. Further, in the plan view, the first groove section 170 is disposed between the first contact surface 112a and the second contact surface 112b and at the position overlapping the optical waveguide 160, and the second groove section 172 is disposed between the second contact surface 112b and the third contact surface 112c and at the position overlapping the optical waveguide 160. Thus, the carriers can be inhibited from migrating due to the difference in carrier density caused between the first portion 162 and the second portion 164 and between the third portion 166 and the second portion 164 (the details will be described later). As a result, the light output can be inhibited from degrading.

Further, in the light emitting device 100, the optical waveguide 160 includes the first portion 162 having the belt-like shape extending from the first exit section 181 provided to the first side surface 131 to the first reflecting section 190 provided to the second side surface 132, the second portion 164 having the belt-like shape extending from the first reflecting section 190 to the second reflecting section 192 provided to the third side surface 133, and the third portion 166 having the belt-like shape extending from the second reflecting section 192 to the second exit section 186 provided to the first side surface 131. Therefore, in the light emitting device 100, the distance D between the exit sections 181, 186 can be adjusted using the second portion 164 without increasing the size in the direction perpendicular to the first side surface 131 in the plan view (see FIG. 1). Thus, in the case of using the light emitting device 100 as the light source of the projector, the distance between the exit sections 181, 186 can easily be adjusted in accordance with, for example, the size of the microlenses (the lens array).

According to the light emitting device 100, the first contact surface 112a of the laminated body 101 with the second electrode 122, the second contact surface 112b of the laminated body 101 with the third electrode 124, and the third contact surface 112c of the laminated body 101 with the fourth electrode 126 are separated from the first reflecting section 190 and the second reflecting section 192 in the plan view. Therefore, the carrier generated by the electrodes 120, 122 and the carrier generated by the electrodes 120, 126 can be inhibited from being injected into the second portion 164 of the optical waveguide 160 due to the light loss caused by the reflecting sections 190, 192. In other words, the carriers can be inhibited from migrating due to the difference in carrier density caused by the reflecting sections 190, 192. As a result, the light output can be inhibited from degrading. Hereinafter, the reason therefor will specifically be explained.

Figure 6A:
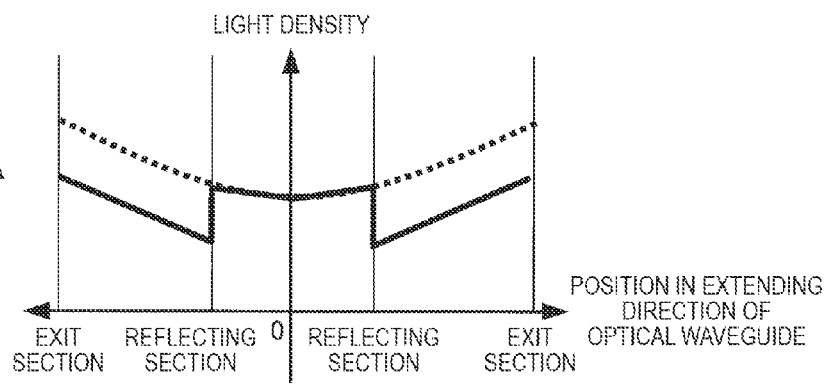
FIGS. 6A and 6B are graphs schematically showing the relationship between the position in the extending direction of the optical waveguide and the light density, and a relationship between the position and a gain, respectively.
Figure 6B:
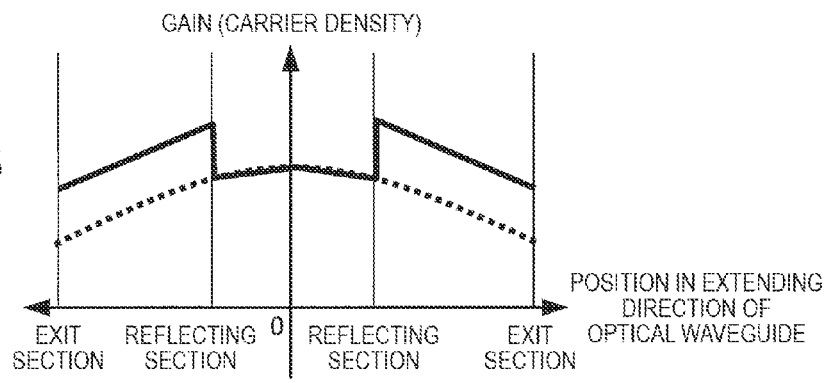
Figure 7A:
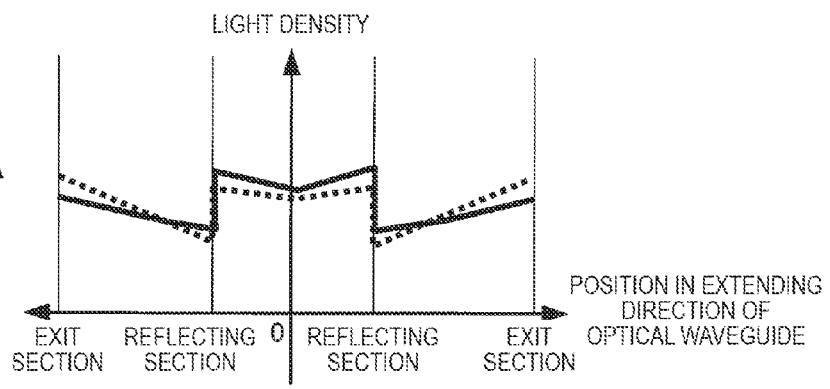
FIGS. 7A and 7B are graphs schematically showing the relationship between the position in the extending direction of the optical waveguide and the light density, and the relationship between the position and the gain, respectively.
Figure 7B:
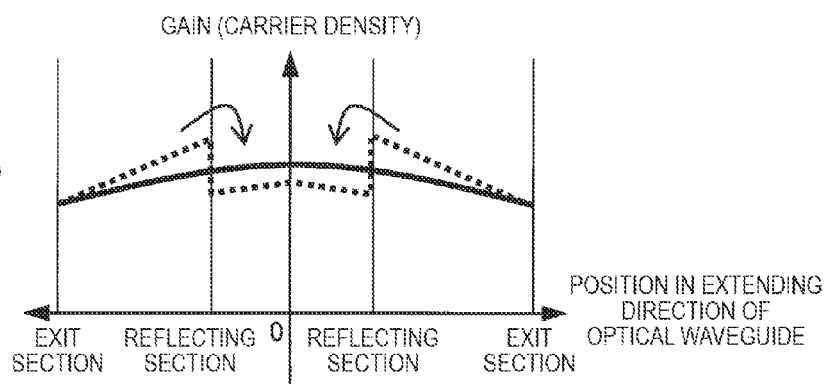

FIGS. 6A and 7A are graphs schematically showing a relationship between the position in the extending direction of the optical waveguide and the light density. FIGS. 6B and 7B are graphs schematically showing a relationship between the position in the extending direction of the optical waveguide and the gain (the carrier density). FIGS. 6A and 6B show the state prior to the migration of the carriers due to the difference in carrier density. FIGS. 7A and 7B show the state after the migration of the carriers due to the difference in carrier density.

It should be noted that in FIGS. 6A and 6B, the curves representing the case of assuming that no light loss exists in the reflecting section are also indicated by the dotted lines. Further, in FIGS. 7A and 7B, the state prior to the migration of the carriers due to the difference in carrier density is also indicated by the dotted lines. Further, in FIGS. 6A, 6B, 7A, and 7B, the optical waveguide with a constant width (the size of the optical waveguide in a direction perpendicular to the extending direction thereof) is assumed. Further, in FIGS. 6A, 6B, 7A, and 7B, only the light proceeding from the position 0 on the horizontal axis toward the tip of the arrow (the outside) is considered.

The light loss in the reflecting section for reflecting the light is heavy compared to the light loss in the straight portion of the optical waveguide. Therefore, as shown in FIGS. 6A and 6B, the light density is lowered in the position of the reflecting section. Since the carrier consumption stops in the area where the light density is lowered, the carrier density (a carrier concentration) increases accordingly in the position of the reflecting section. Thus, the difference in carrier density occurs (a variation occurs in the carrier distribution) at the position of the reflecting section as a boundary. As a result, as shown in FIGS. 7A and 7B, the carriers migrate from apart with a high carrier density toward a part with a low carrier density. Thus, the carrier density increases in the anterior part (e.g., the central part of the optical waveguide) of the reflecting section, and the gain of the light increases. However, since the light is amplified in the anterior part of the reflecting section as a loss part of the light, the light loss in the reflecting section increases, and the net light output is decreased. It should be noted that the propagation loss occupies the large part of the light loss in the straight portion of the optical waveguide, and it can be said that the light loss is substantially the propagation loss.

In the light emitting device 100, as described above, the contact surfaces 112a, 112b, and 112c are separated from the reflecting sections 190, 192 in the plan view. Further, in the plan view, the first groove section 170 is disposed between the first contact surface 112a and the second contact surface 112b and at the position overlapping the optical waveguide 160, and the second groove section 172 is disposed between the second contact surface 112b and the third contact surface 112c and at the position overlapping the optical waveguide 160. Therefore, in the light emitting device 100, the carriers can be inhibited from migrating due to the difference in carrier density caused between the anterior and posterior portions of each of the reflecting sections 190, 192 (the anterior and posterior portions of each of the reflecting sections 190, 192 in the extending direction of the optical waveguide 160). As a result, in the light emitting device 100, the problem described above can be avoided, and the light output can be inhibited from degrading.

Further, in the light emitting device 100, the insulating property between the second electrode 122 and the third electrode 124 can be enhanced using the first groove section 170. Similarly, the insulating property between the third electrode 124 and the fourth electrode 126 can be enhanced using the second groove section 172.

According to the light emitting device 100, the first groove section 170 and the second groove section 172 penetrate the contact layer 110, and reach the second cladding layer 108. Therefore, the carriers can more surely be inhibited from migrating due to the difference in carrier density generated between the anterior and posterior portions of each of the reflecting sections 190, 192. It should be noted that although not shown in the drawings, it is also possible for the first groove section 170 and the second groove section 172 to penetrate the contact layer 110 and the second cladding layer 108. Thus, the carriers can more surely be inhibited from migrating due to the difference in carrier density generated between the anterior and posterior portions of each of the reflecting sections 190, 192.

According to the light emitting device 100, in the plan view, the first portion 162 is connected to the first side surface 131 obliquely with respect to the perpendicular P1 of the first side surface 131, and the third portion 166 is connected to the first side surface 131 obliquely with respect to the perpendicular P1 of the first side surface 131. To this end, in the light emitting device 100, it can be reduced to multiply-reflect the light generated in the optical waveguide 160 directly between the first end surface 181 and the sixth end surface 186. Thus, it can be prevented to constitute a direct resonator, and thus, the laser oscillation of the light generated in the optical waveguide 160 can be suppressed. Therefore, in the light emitting device 100, the speckle noise can be reduced.

1.2. Method of Manufacturing Light Emitting Device

Figure 8:
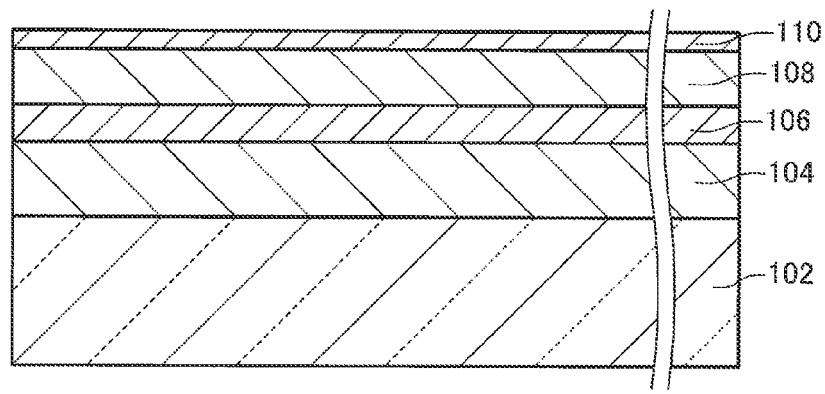
FIG. 8 is a cross-sectional view schematically showing a manufacturing process of the light emitting device according to the first embodiment.
Figure 9:
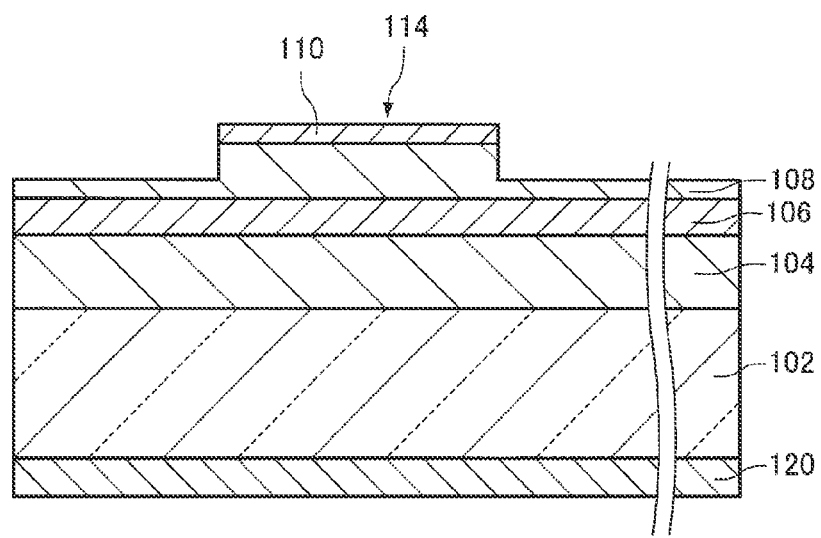
FIG. 9 is a cross-sectional view schematically showing the manufacturing process of the light emitting device according to the first embodiment.
Figure 10:
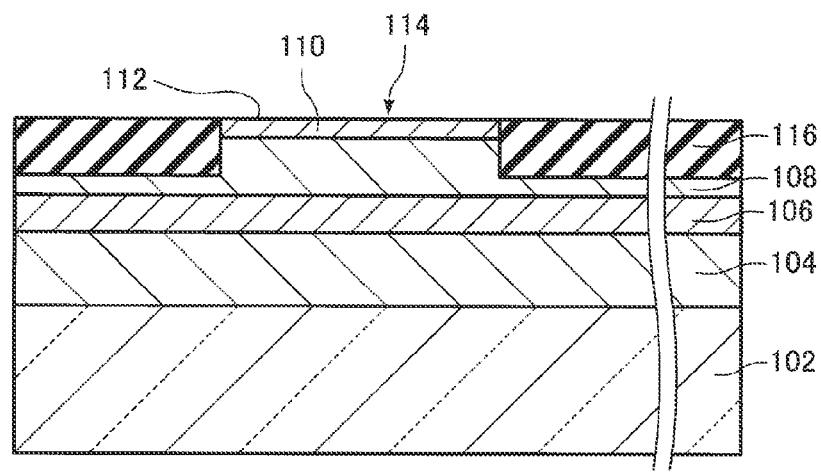
FIG. 10 is a cross-sectional view schematically showing the manufacturing process of the light emitting device according to the first embodiment.

Then, a method of manufacturing the light emitting device according to the first embodiment will be explained with reference to the accompanying drawings. FIGS. 8 through 10 are cross-sectional views schematically showing the manufacturing process of the light emitting device 100 according to the first embodiment, and each correspond to FIG. 2.

As shown in FIG. 8, the first cladding layer 104, the active layer 106, the second cladding layer 108, and the contact layer 110 are grown epitaxially on the substrate 102 in this order. As the method of epitaxially growing the layers, there can be used, for example, a metal organic chemical vapor deposition (MOCVD) method, and a molecular beam epitaxy (MBE) method.

As shown in FIG. 9, the contact layer 110 and the second cladding layer 108 are patterned. The patterning is performed using, for example, a photolithography process and an etching process. According to the present process, the columnar section 114 can be formed. Further, in the present process, the groove sections 170, 172 (see FIGS. 1 and 3) can be formed. It should be noted that the process for forming the columnar section 114 and the process for forming the groove sections 170, 172 can be performed as separated processes.

As shown in FIG. 10, the insulating layer 116 is formed so as to cover the side surfaces of the columnar section 114. Specifically, an insulating member (not shown) is firstly deposited above (including the surface of the contact layer 110) the second cladding layer 108 using, for example, a chemical vapor deposition (CVD) method or a coating method. Subsequently, the upper surface 112 of the contact layer 110 is exposed using, for example, an etching process. According to the process described hereinabove, the insulating layer 116 can be formed. Further, in the present process, the insulating layer 118 (see FIG. 3) can be formed in the groove sections 170, 172. It should be noted that the process for forming the insulating layer 116 and the process for forming the insulating layer 118 can be performed as separated processes.

As shown in FIGS. 1 and 3, the opening sections 140, 142 are formed in the laminated body 101 to thereby expose the side surfaces 132, 133. The opening sections 140, 142 are formed by patterning using the photolithography process and the etching process. It should be noted that the sequence of the process of forming the opening sections 140, 142 and the process of forming the electrodes 120, 122, 124, and 126 described later is not particularly limited.

As shown in FIGS. 1 and 2, the electrodes 122, 124, and 126 are formed on the contact layer 110. The electrodes 122, 124, and 126 are formed using, for example, a vacuum deposition method. The electrodes 122, 124, and 126 can also be formed by forming a mask layer having a predetermined shape not shown, then depositing an electrode layer, and then removing the mask layer (liftoff method). Subsequently, heat treatment for forming an alloy can also be performed.

Subsequently, the first electrode 120 is formed on the lower surface of the substrate 102. The first electrode 120 is formed using, for example, a vacuum deposition method. After the deposition using the vacuum deposition method, heat treatment for forming an alloy can also be performed. It should be noted that the sequence of the process of forming the first electrode 120 and the process of forming the electrodes 122, 124, and 126 is not particularly limited. Further, it is also possible to expose the side surfaces 131, 134, 135, 136 of the active layer 106 by cleavage after forming the electrodes 120, 122, 124, and 126.

According to the process described hereinabove, the light emitting device 100 can be manufactured.

According to the manufacturing method of the light emitting device 100, the light emitting device 100 capable of inhibiting the light output from degrading due to the saturation of the gain can be obtained.

1.3. Modified Examples of Light Emitting Device 1.3.1. First Modified Example

Figure 11:
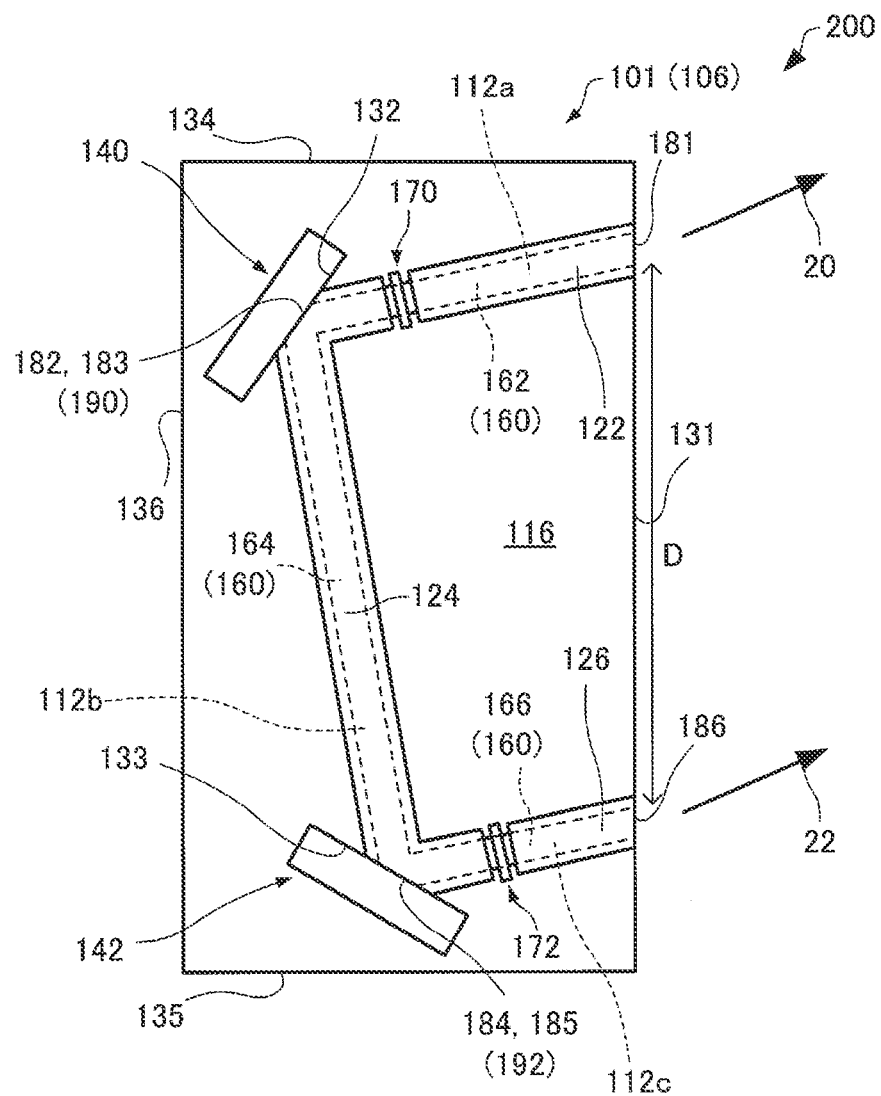
FIG. 11 is a plan view schematically showing alight emitting device according to a first modified example of the first embodiment.

Then, a light emitting device according to a first modified example of the first embodiment will be explained with reference to the accompanying drawings. FIG. 11 is a plan view schematically showing a light emitting device 200 according to the first modified example of the first embodiment.

Hereinafter, in the light emitting device 200 according to the first modified example of the first embodiment, the members having the same functions as those of the constituent members of the light emitting device 100 according to the first embodiment will be denoted by the same reference symbols, and the detailed explanation thereof will be omitted. The same applies to a light emitting device 300 according to a second modified example of the first embodiment described later.

As shown in FIG. 1, in the light emitting device 100, the current is injected into the first portion 162 of the optical waveguide 160 only by the electrodes 120, 122, the current is injected into the second portion 164 only by the electrodes 120, 124, and the current is injected into the third portion 166 only by the electrodes 120, 126.

In contrast, in the light emitting device 200, as shown in FIG. 11, the current is injected into the first portion 162 by the electrodes 120, 122, and 124, and the current is injected into the third portion 166 by the electrodes 120, 124, and 126.

Specifically, the first portion 162 includes a part located between the electrodes 120, 122 and a part located between the electrodes 120, 124. In the example shown in the drawing, the first groove section 170 is disposed between the electrodes 122, 124, and at the position overlapping the first portion 162. The first groove section 170 is located closer to the first exit section 181 than the first reflecting section 190 in the extending direction of the optical waveguide 160.

The third portion 166 includes a part located between the electrodes 120, 124 and a part located between the electrodes 120, 126. In the example shown in the drawing, the second groove section 172 is disposed between the electrodes 124, 126, and at the position overlapping the third portion 166 in the plan view. The second groove section 172 is located closer to the second exit section 186 than the second reflecting section 192 in the extending direction of the optical waveguide 160.

The third electrode 124 overlaps the whole of the second portion 164 in the plan view. Further, the third electrode 124 overlaps a part of the first portion 162 and a part of the third portion 166 in the plan view. In the example shown in the drawing, the third electrode 124 has contact with the reflecting sections 190, 192 in the plan view.

According to the light emitting device 200, by setting the current density between the electrodes 122, 126 having no contact with the reflecting sections 190, 192 in the plan view and the electrode 120 to be higher than the current density between the electrode 124 having contact with the reflecting sections 190, 192 and the electrode 120, it is possible to reduce the light loss in the reflecting sections 190, 192 while suppressing the gain saturation. If, for example, the current density between one electrode having contact with the reflecting section and the other electrode is set higher than the current density between one electrode having no contact with the reflecting section and the other electrode, the loss of the light in the reflecting section increases, and improvement in efficiency might be unachievable in some cases.

1.3.2. Second Modified Example

Figure 12:
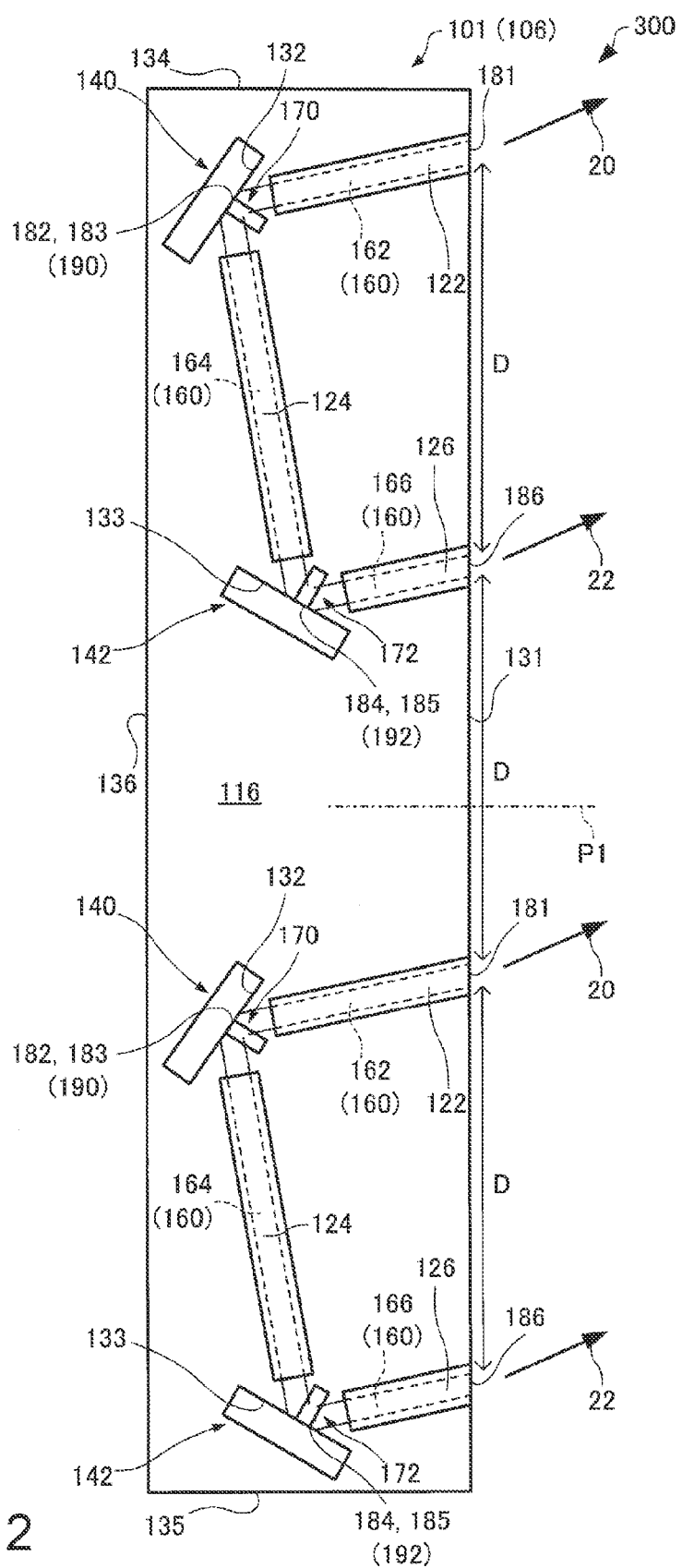
FIG. 12 is a plan view schematically showing alight emitting device according to a second modified example of the first embodiment.

Then, a light emitting device according to a second modified example of the first embodiment will be explained with reference to the accompanying drawings. FIG. 12 is a plan view schematically showing the light emitting device 300 according to the second modified example of the first embodiment.

As shown in FIG. 1, in the light emitting device 100, the single optical waveguide 160 is disposed. In contrast, in the light emitting device 300, a plurality of optical waveguides 160 are disposed as shown in FIG. 12. Although the two optical waveguides 160 are provided in the example shown in the drawing, the number of the optical waveguides 160 is not particularly limited providing the number is equal to or larger than two. The plurality of optical waveguides 160 are arranged in a direction perpendicular to the perpendicular P1 of the first side surface 131. In the example shown in the drawing, the first exit section 181 and the second exit section 186 are separated with the distance D from each other in each of the optical waveguides 160, and the first exit section 181 of one of the optical waveguides 160 and the second exit section 186 of the other of the optical waveguides 160 are separated with the distance D from each other.

According to the light emitting device 300, a higher output can be achieved compared to the example of the light emitting device 100.

2. Second Embodiment

2.1. Light Emitting Device

Figure 13:
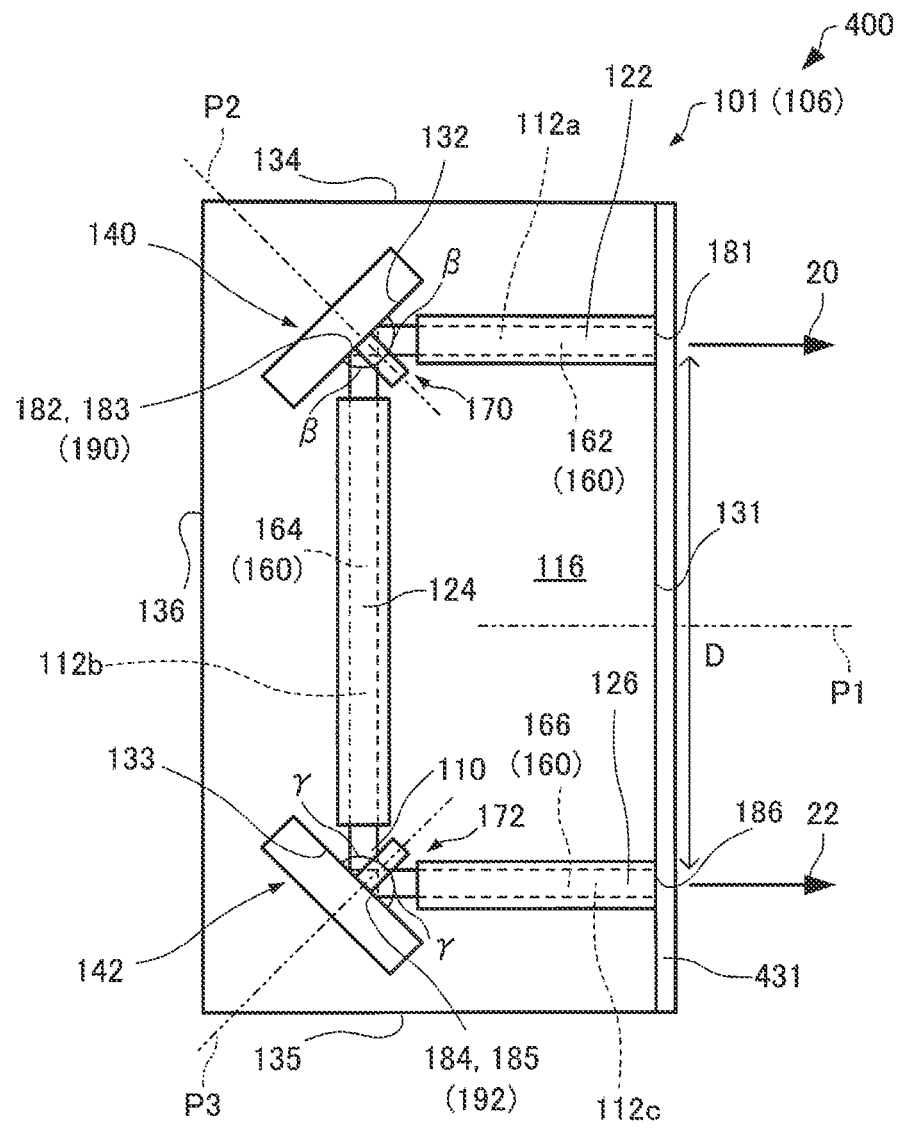
FIG. 13 is a plan view schematically showing alight emitting device according to a second embodiment of the invention.

Then, a light emitting device according to a second embodiment will be explained with reference to the accompanying drawings. FIG. 13 is a plan view schematically showing a light emitting device 400 according to the second embodiment.

Hereinafter, in the light emitting device 400 according to the second embodiment, the members having the same functions as those of the constituent members of the light emitting device 100 according to the first embodiment will be denoted with the same reference symbols, and detailed explanation thereof will be omitted.

As shown in FIG. 1, in the light emitting device 100, the first portion 162 and the third portion 166 of the optical waveguide 160 are connected to the first side surface 131 obliquely at an angle α (the angle α is an acute angle larger than 0°) with the perpendicular P1 of the first side surface 131 in the plan view.

In contrast, in the light emitting device 400, as shown in FIG. 13, the first portion 162 and the third portion 166 of the optical waveguide 160 are perpendicular to the first side surface 131 in the plan view. In other words, in the light emitting device 400, the extending directions of the first portion 162 and the third portion 166 are parallel to the perpendicular P1 of the first side surface 131. Specifically, the angle α is 0°, and both of the angle β and the angle γ are 45°.

In the light emitting device 400, the first side surface 131 is covered by an antireflection film 431. As the antireflection film 431, for example, an $SiO_2$ layer, a $Ta_2O_5$ layer, an $Al_2O_3$ layer, a TiN layer, a $TiO_2$ layer, an SiON layer, an SiN layer, or a multilayer film of any of these layers is used. Due to the antireflection film 431, in the light emitting device 400, it can be reduced to multiply-reflect the light generated in the optical waveguide 160 directly between the first end surface 181 and the sixth end surface 186. Therefore, it can be prevented to constitute a direct resonator, and thus, the laser oscillation of the light generated in the optical waveguide 160 can be suppressed. Therefore, in the light emitting device 400, the speckle noise can be reduced.

In the light emitting device 400, the area of the second electrode 122 and the area of the fourth electrode 126 can also be equal to each other in the plan view. In this case, since, for example, the light density in the first portion 162 and the light density in the third portion 166 are equal to each other, the amplitude of the current density of the current injected into the first portion 162 by the electrodes 120, 122 and the amplitude of the current density of the current injected into the third portion 166 by the electrodes 120, 126 can be equal to each other. Thus, the current control when driving the device can be made easier compared to the case in which the current density of the current injected into the first portion 162 by the electrodes 120, 122 and the current density of the current injected into the third portion 166 by the electrodes 120, 126 are different from each other. Further, the second electrode 122 and the fourth electrode 126 can electrically be connected to each other. Further, the second electrode 122 and the fourth electrode 126 can be formed of a common electrode. Thus, the amplitude of the current density of the current injected into the first portion 162 by the electrodes 120, 122 and the amplitude of the current density of the current injected into the third portion 166 by the electrodes 120, 126 can easily be made the same as (equal to) each other. As a result, the current control when driving the light emitting device 400 can be made easy. It should be noted that although not shown in the drawing, the area of the second electrode 122 and the area of the fourth electrode 126 can also be different from each other in the plan view.

According to the light emitting device 400, similarly to the light emitting device 100, the light output can be inhibited from degrading due to the saturation of the gain.

2.2. Method of Manufacturing Light Emitting Device

Then, a method of manufacturing the light emitting device according to the second embodiment will be explained. The method of manufacturing the light emitting device according to the second embodiment is basically the same as the method of manufacturing the light emitting device according to the first embodiment except the point that the antireflection film 431 is formed on the first side surface 131 using, for example, a CVD method. Therefore, the detailed explanation thereof will be omitted.

2.3. Modified Example of Light Emitting Device

Figure 14:
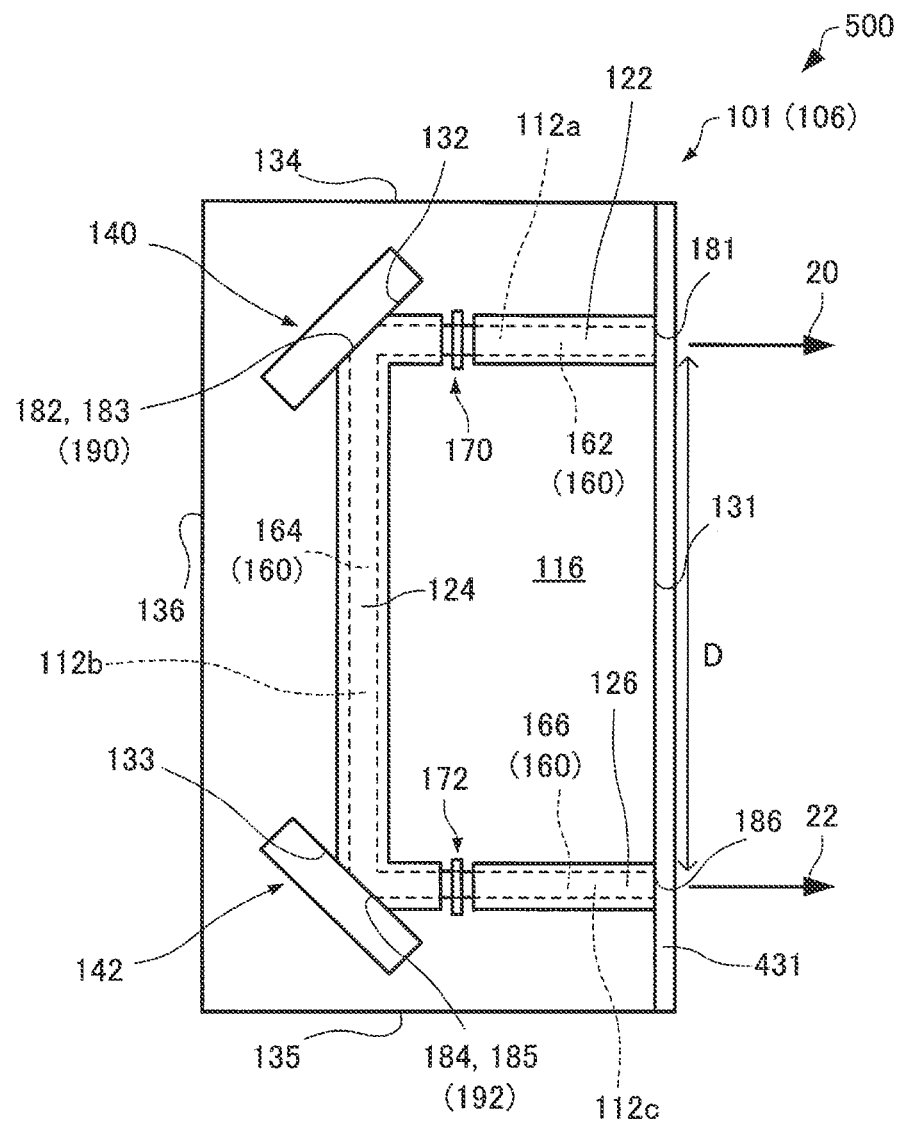
FIG. 14 is a plan view schematically showing alight emitting device according to a modified example of the second embodiment.

Then, a light emitting device according to a modified example of the second embodiment will be explained with reference to the accompanying drawings. FIG. 14 is a plan view schematically showing a light emitting device 500 according to the modified example of the second embodiment.

Hereinafter, in the light emitting device 500 according to the modified example of the second embodiment, the members having the same functions as those of the constituent members of the light emitting device 100 according to the first embodiment or the light emitting device 400 according to the second embodiment will be denoted with the same reference symbols, and detailed explanation thereof will be omitted.

As shown in FIG. 13, in the light emitting device 400, the current is injected into the first portion 162 of the optical waveguide 160 only by the electrodes 120, 122, the current is injected into the second portion 164 only by the electrodes 120, 124, and the current is injected into the third portion 166 only by the electrodes 120, 126.

In contrast, in the light emitting device 500, as shown in FIG. 14, the current is injected into the first portion 162 by the electrodes 120, 122, and 124, and the current is injected into the third portion 166 by the electrodes 120, 124, and 126.

Specifically, the first portion 162 includes a part located between the electrodes 120, 122 and a part located between the electrodes 120, 124. In the example shown in the drawing, the first groove section 170 is disposed between the electrodes 122, 124, and at the position overlapping the first portion 162. The first groove section 170 is located closer to the first exit section 181 than the first reflecting section 190 in the extending direction of the optical waveguide 160.

The third portion 166 includes a part located between the electrodes 120, 124 and a part located between the electrodes 120, 126. In the example shown in the drawing, the second groove section 172 is disposed between the electrodes 124, 126, and at the position overlapping the third portion 166 in the plan view. The second groove section 172 is located closer to the second exit section 186 than the second reflecting section 192 in the extending direction of the optical waveguide 160.

The third electrode 124 overlaps the whole of the second portion 164 in the plan view. Further, the third electrode 124 overlaps a part of the first portion 162 and a part of the third portion 166 in the plan view. In the example shown in the drawing, the third electrode 124 has contact with the reflecting sections 190, 192 in the plan view.

According to the light emitting device 500, similarly to the light emitting device 200, the light loss in the reflecting sections 190, 192 can be reduced.

3. Third Embodiment

Figure 15:
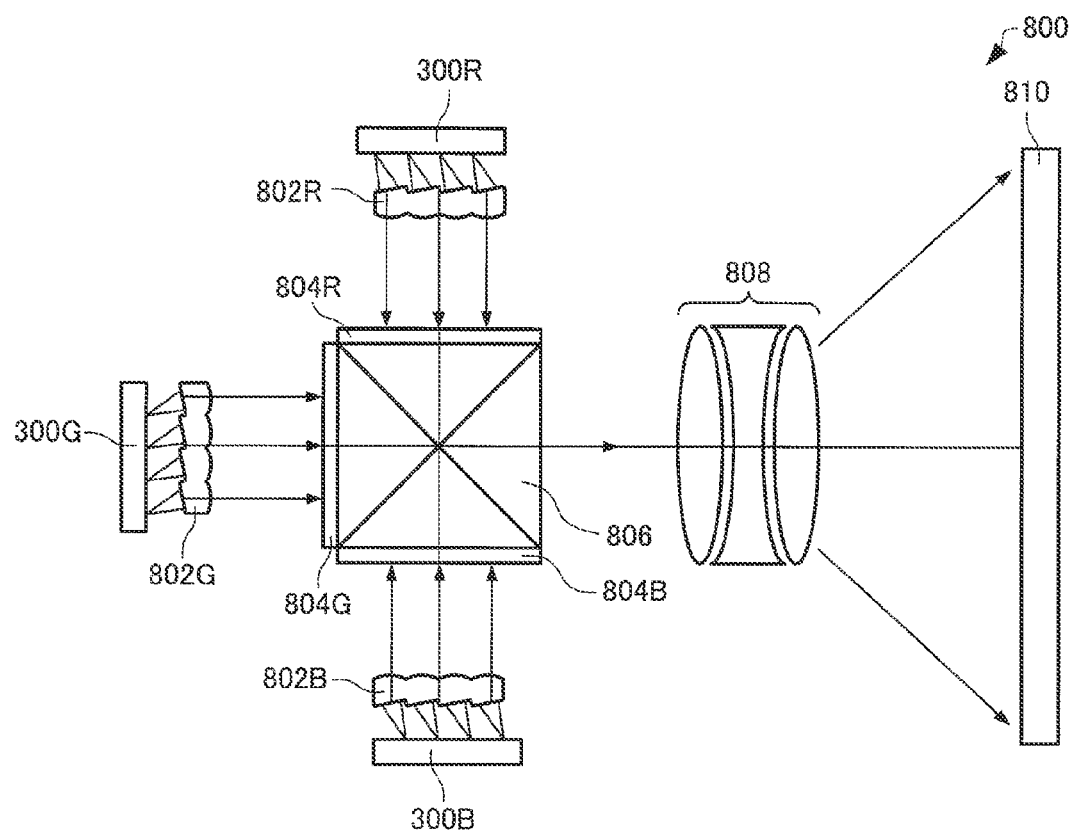
FIG. 15 is a diagram schematically showing a projector according to a third embodiment of the invention.
Figure 16:
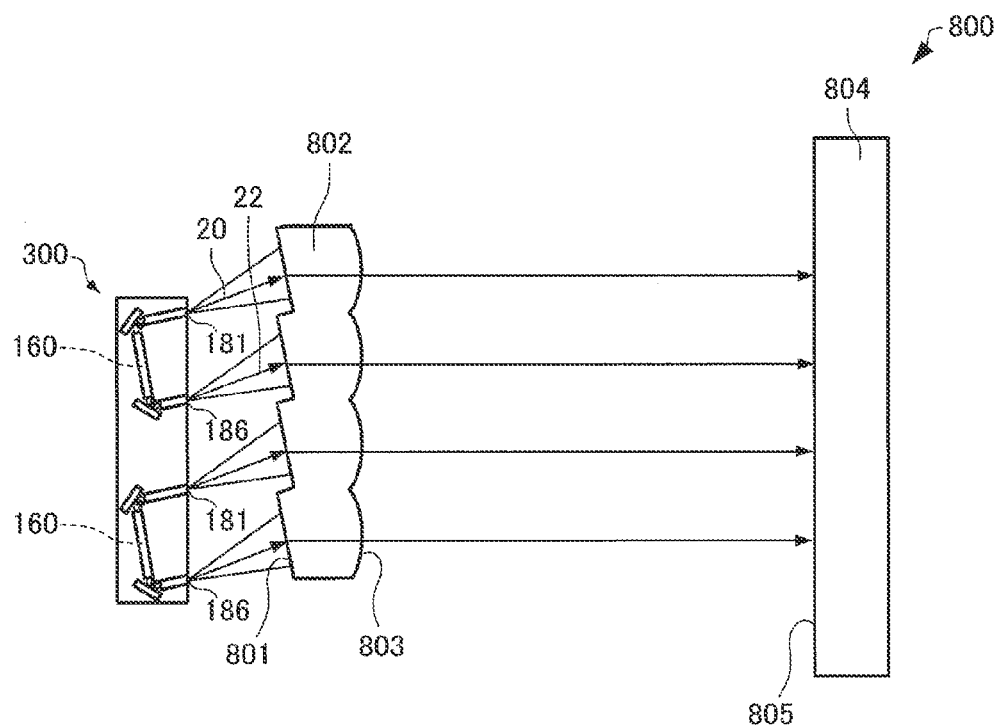
FIG. 16 is a diagram schematically showing the projector according to the third embodiment.

Then, a projector according to a third embodiment will be explained with reference to the accompanying drawings. FIG. 15 is a diagram schematically showing a projector 800 according to the third embodiment. FIG. 16 is a diagram schematically showing a part of the projector 800 according to the third embodiment.

It should be noted that in FIG. 15, a housing constituting the projector 800 is omitted, and further, light sources 300 are shown schematically for the sake of convenience. Further, in FIG. 16, the light source 300, a lens array 802, and a liquid crystal light valve 804 are shown, and the light source 300 is shown schematically for the sake of convenience.

As shown in FIGS. 15 and 16, the projector 800 includes a red light source 300R, a green light source 300G, and a blue light source 300B for respectively emitting red light, green light, and blue light. The red light source 300R, the green light source 300G, and the blue light source 300B are each the light emitting device according to the invention. Hereinafter, an example of using the light emitting device 300 as the light emitting device according to the invention will be explained.

The projector 800 further includes lens arrays 802R, 802G, and 802B, transmissive liquid crystal light valves (light modulation devices) 804R, 804G, and 804B, and a projection lens (a projection device) 808.

The lights emitted from the light sources 300R, 300G, and 300B enter the lens arrays 802R, 802G, and 802B, respectively. As shown in FIG. 16, the lens array 802 has flat surfaces 801, which either one of the lights 20, 22 emitted respectively from the exit sections 181, 186 enters, disposed on the light source 300 side. The flat surfaces 801 are disposed so as to correspond respectively to the plurality of light exit sections 181, 186, and are arranged at regular intervals. The normal line (not shown) of each of the flat surfaces 801 is tilted with respect to the light axes of the lights 20, 22. Therefore, the light axes of the lights 20, 22 can be made perpendicular to an irradiation surface 805 of the liquid crystal light valve 804 using the flat surfaces 801.

The lens array 802 has convex curves 803 on the liquid crystal light valve 804 side. The convex curves 803 are disposed so as to correspond respectively to the plurality of flat surfaces 801, and are arranged at regular intervals. The lights 20, 22 having the light axes converted in the flat surface 801 are collected, or reduced in diffusion angle by the convex curves 803, and can thus be overlapped (partially overlapped). Thus, it is possible to irradiate the liquid crystal light valve 804 with uniformity.

As described above, the lens array 802 can control the light axes of the lights 20, 22 emitted from the light source 300 to thereby collect the lights 20, 22.

As shown in FIG. 15, the lights collected by the lens arrays 802R, 802G, and 802B enter the liquid crystal light valves 804R, 804G, and 804B, respectively. The liquid crystal light valves 804R, 804G, and 804B respectively modulate the incident lights in accordance with image information. Then, the projection lens 808 magnifies the images formed by the liquid crystal light valves 804R, 804G, and 804B, and projects them on a screen (a display surface) 810.

Further, the projector 800 can include a cross dichroic prism (a colored light combining section) 806 for combining the lights emitted from the liquid crystal light valves 804R, 804G, and 804B and then guiding the combined light to the projection lens 808.

The three colored lights modulated by the respective liquid crystal light valves 804R, 804G, and 804B enter the cross dichroic prism 806. This prism is formed by bonding four rectangular prisms to each other, and is provided with a dielectric multilayer film for reflecting the red light and a dielectric multilayer film for reflecting the blue light disposed on the inside surfaces so as to form a crisscross. The three colored lights are combined by these dielectric multilayer films to thereby form the light representing a color image. Then, the light thus combined is projected on the screen 808 by the projection lens 810 as the projection optical system, and thus an enlarged image is displayed.

According to the projector 800, the light emitting device 300 capable of inhibiting the light output from degrading due to the saturation of the gain can be included.

Therefore, according to the projector 800, there is included the light emitting device 300 capable of adjusting the distance D between the exit sections 181, 186 using the second portion 164 without increasing the length in the direction perpendicular to the first side surface 131 (see FIG. 12). Thus, the distance D between the exit sections 181, 186 can easily be adjusted in accordance with the size of the lens array 802. Therefore, in the projector 800, the alignment of the lens arrays 802 is easy, and the liquid crystal light valves 804 can be irradiated with uniformity.

According to the projector 800, since there is adopted the type (the backlight type) of disposing the light sources 300 immediately below the light valves 804, and performing light collection and uniform illumination at the same time using the lens arrays 802, reduction in loss of the optical system and reduction in the number of components can be achieved.

It should be noted that although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and digital Micromirror Device™. Further, the configuration of the projection optical system is appropriately modified in accordance with the type of the light valves used therein.

Further, by scanning the light from the light source 300 on the screen, it is possible to apply the light source 300 also to the light source device of a scanning type image display device (a projector) having a scanning section as an image forming device for displaying an image with a desired size on the display surface.

The embodiments and the modified examples described above are illustrative only, and the invention is not limited to the examples. For example, it is also possible to arbitrarily combine the embodiments and the modified examples described above with each other.

The invention includes configurations (e.g., configurations having the same function, the same way, and the same result, or configurations having the same object and the same advantage) substantially the same as any of the configurations described as the embodiments of the invention. Further, the invention includes configurations obtained by replacing a non-essential part of the configuration described as the embodiments of the invention. Further, the invention includes configurations exerting the same functional effects and configurations capable of achieving the same object as any of the configurations described as the embodiments of the invention. Further, the invention includes configurations obtained by adding known technologies to any of the configurations described as the embodiments of the invention.

The entire disclosure of Japanese Patent Application No. 2013-018181, filed Feb. 1, 2013 is expressly incorporated by reference herein.

What is claimed is:

1. A light emitting device comprising:
a laminated body having an active layer adapted to generate light in response to injection of a current, a first cladding layer and a second cladding layer sandwiching the active layer;
a first electrode electrically connected to the first cladding layer; and
a second electrode, a third electrode, and a fourth electrode electrically connected to the second cladding layer,
wherein the active layer constitutes an optical waveguide adapted to guide the light,
the optical waveguide includes
a first portion having a belt-like shape connecting a first exit section disposed on a first side surface of the active layer and a first reflecting section disposed on a second side surface of the active layer to each other,
a second portion having a belt-like shape connecting the first reflecting section and a second reflecting section disposed on a third side surface of the active layer to each other, and
a third portion having a belt-like shape connecting the second reflecting section and a second exit section disposed on the first side surface to each other,
a current is injected into the first portion by the first electrode and the second electrode,
a current is injected into the second portion by the first electrode and the third electrode,
a current is injected into the third portion by the first electrode and the fourth electrode, and
a current density of the current injected into the first portion by the first electrode and the second electrode, and a current density of the current injected into the third portion by the first electrode and the fourth electrode are higher than a current density of the current injected into the second portion by the first electrode and the third electrode.

2. The light emitting device according to claim 1, wherein a first contact section, which is a part where the second electrode and the laminated body have electrical contact with each other, a second contact section, which is a part where the third electrode and the laminated body have electrical contact with each other, and a third contact section, which is a part where the fourth electrode and the laminated body have electrical contact with each other are separated from the first reflecting section and the second reflecting section viewed from a stacking direction of the laminated body.

3. The light emitting device according to claim 1, wherein a current is further injected into the first portion by the first electrode and the third electrode, and
a current is further injected into the third portion by the first electrode and the third electrode.

4. The light emitting device according to claim 1, wherein the current density of the current injected into the first portion by the first electrode and the second electrode and the current density of the current injected into the third portion by the first electrode and the fourth electrode are equal to each other.

5. The light emitting device according to claim 4, wherein the second electrode and the fourth electrode are electrically connected to each other.

6. The light emitting device according to claim 1, wherein the laminated body includes
a first groove section disposed between a first contact section, which is a part where the second electrode and the laminated body have electrical contact with each other, and a second contact section, which is a part where the third electrode and the laminated body have electrical contact with each other, and at a position overlapping the optical waveguide viewed from a stacking direction of the laminated body, and
a second groove section disposed between the second contact section and a third contact section, which is a part where the fourth electrode and the laminated body have electrical contact with each other, and at a position overlapping the optical waveguide viewed from the stacking direction of the laminated body.

7. The light emitting device according to claim 6, wherein the laminated body includes a contact layer formed on the second cladding layer, and
the first groove section and the second groove section are provided to the contact layer.

8. The light emitting device according to claim 7, wherein the first groove section and the second groove section penetrate the contact layer to reach the second cladding layer.

9. The light emitting device according to claim 8, wherein the first groove section and the second groove section penetrate the contact layer and the second cladding layer.

10. The light emitting device according to claim 1, wherein the first portion and the third portion are connected to the first side surface obliquely with respect to a perpendicular of the first side surface viewed from a stacking direction of the laminated body.

11. A light emitting device comprising:
an active layer adapted to generate light in response to injection of a current,
wherein the active layer includes
a first exit section and a second exit section each adapted to emit the light,
an optical waveguide adapted to connect the first exit section and the second exit section to each other, and
a first inflecting section and a second inflecting section at which a proceeding direction of the light guided by the optical waveguide is changed,
a current density of a current injected into a part of the optical waveguide located between the first exit section and the first inflecting section is higher than a current density of a current injected into a part of the optical waveguide located between the first inflecting section and the second inflecting section, and
a current density of a current injected into a part of the optical waveguide located between the second exit section and the second inflecting section is higher than the current density of the current injected into the part of the optical waveguide located between the first inflecting section and the second inflecting section.

12. A projector comprising:
the light emitting device according to claim 1;
a light modulation device adapted to modulate the light emitted from the light emitting device in accordance with image information; and
a projection device adapted to project the image formed by the light modulation device.

13. A projector comprising:
the light emitting device according to claim 2;
a light modulation device adapted to modulate the light emitted from the light emitting device in accordance with image information; and
a projection device adapted to project the image formed by the light modulation device.

14. A projector comprising:
the light emitting device according to claim 3;
a light modulation device adapted to modulate the light emitted from the light emitting device in accordance with image information; and
a projection device adapted to project the image formed by the light modulation device.

15. A projector comprising:
the light emitting device according to claim 4;
a light modulation device adapted to modulate the light emitted from the light emitting device in accordance with image information; and
a projection device adapted to project the image formed by the light modulation device.

16. A projector comprising:
the light emitting device according to claim 5;
a light modulation device adapted to modulate the light emitted from the light emitting device in accordance with image information; and
a projection device adapted to project the image formed by the light modulation device.

17. A projector comprising:
the light emitting device according to claim 6;
a light modulation device adapted to modulate the light emitted from the light emitting device in accordance with image information; and
a projection device adapted to project the image formed by the light modulation device.

18. A projector comprising:
the light emitting device according to claim 7;
a light modulation device adapted to modulate the light emitted from the light emitting device in accordance with image information; and
a projection device adapted to project the image formed by the light modulation device.

19. A super-luminescent diode comprising:
a laminated body having an active layer adapted to generate light in response to injection of a current, a first cladding layer and a second cladding layer sandwiching the active layer;
a first electrode electrically connected to the first cladding layer; and
a second electrode, a third electrode, and a fourth electrode electrically connected to the second cladding layer,
wherein the active layer constitutes an optical waveguide adapted to guide the light,
the optical waveguide includes
a first portion having a belt-like shape connecting a first exit section disposed on a first side surface of the active layer and a first reflecting section disposed on a second side surface of the active layer to each other,
a second portion having a belt-like shape connecting the first reflecting section and a second reflecting section disposed on a third side surface of the active layer to each other, and
a third portion having a belt-like shape connecting the second reflecting section and a second exit section disposed on the first side surface to each other,
a current is injected into the first portion by the first electrode and the second electrode,
a current is injected into the second portion by the first electrode and the third electrode,
a current is injected into the third portion by the first electrode and the fourth electrode, and
a current density of the current injected into the first portion by the first electrode and the second electrode, and a current density of the current injected into the third portion by the first electrode and the fourth electrode are higher than a current density of the current injected into the second portion by the first electrode and the third electrode.

20. A projector comprising:
the super-luminescent diode according to claim 19;
a light modulation device adapted to modulate the light emitted from the super-luminescent diode in accordance with image information; and
a projection device adapted to project the image formed by the light modulation device.

\* \* \* \* \*